(12) United States Patent  
Ishikawa

(10) Patent No.: US 6,591,406 B2
(45) Date of Patent: Jul. 8, 2003

(54) SEMICONDUCTOR APPARATUS INCLUDING BYPASS CAPACITOR HAVING STRUCTURE FOR MAKING AUTOMATIC DESIGN EASY, AND SEMICONDUCTOR APPARATUS LAYOUT METHOD

(75) Inventor: Hirotaka Ishikawa, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 89 days.

(21) Appl. No.: 09/748,208

(22) Filed: Dec. 27, 2000

(65) Prior Publication Data
US 2001/0042238 A1 Nov. 15, 2001

(30) Foreign Application Priority Data
Dec. 27, 1999 (JP) .......................... 11-371309

(51) Int. Cl.[7] ............................. G06F 17/50
(52) U.S. Cl. .............. 716/8; 716/9; 716/12; 716/13
(58) Field of Search .............. 716/8, 1–21; 361/306, 361/301; 257/207, 210, 532

(56) References Cited

U.S. PATENT DOCUMENTS 5,869,852 A * 2/1999 Kinoshita .................. 257/207
6,054,751 A * 4/2000 Ichikawa et al. ........... 257/379
6,061,222 A * 5/2000 Morris et al. ............... 257/533
6,147,857 A * 11/2000 Worley et al. ............. 361/301.2
6,201,411 B1 * 3/2001 Lesea ......................... 326/101
6,434,730 B1 * 8/2002 Ito et al. ..................... 716/10
6,445,564 B1 * 9/2002 Naitoh ...................... 361/301.2

FOREIGN PATENT DOCUMENTS

| JP | 5-283615 | 10/1993 |
| JP | A 7-106521 | 4/1995 |
| JP | A 9-64284 | 3/1997 |
| JP | 10-284605 | 10/1998 |
| JP | 10-340959 | 12/1998 |
| JP | 11-204766 | 7/1999 |
| JP | 11-233636 | 8/1999 |

* cited by examiner

Primary Examiner—Matthew Smith
Assistant Examiner—Magid Dimyan
(74) Attorney, Agent, or Firm—Young & Thompson

(57) ABSTRACT

A semiconductor apparatus, includes a semiconductor substrate, a first wiring, a second wiring and a capacitance cell. The first wiring is provided in the semiconductor substrate. The second wiring is provided in the semiconductor substrate. The capacitance cell includes a bypass capacitor connecting the first wiring to the second wiring.

13 Claims, 21 Drawing Sheets

SEMICONDUCTOR APPARATUS INCLUDING BYPASS CAPACITOR HAVING STRUCTURE FOR MAKING AUTOMATIC DESIGN EASY, AND SEMICONDUCTOR APPARATUS LAYOUT METHOD

BACKGROUND OF THE INVENTION

1. Field of the Invention

The present invention relates to a semiconductor apparatus and a semiconductor apparatus layout method. More particularly, the present invention relates to a semiconductor apparatus having a bypass capacitor and a layout method of a semiconductor apparatus having a bypass capacitor.

2. Description of the Related Art

A layout method using an automatic layout system is used in designing a semiconductor apparatus. Such a layout method is known in Japanese Laid Open Patent Application (JP-A-Heisei, 10-340959). In this known layout method, a hard macro is firstly arranged as shown in FIG. 1 (S101). At this time, a hard macro library 403 including a circuit connection information 401, a cell library 402, a terminal of a hard macro, a wiring inhibition and an external shape is inputted to an automatic layout system.

After the arrangement of the hard macro (S101), power supply wiring (S102), an automatic arrangement of a cell (S103) based on the circuit connection information, a schematic wiring (S104) and a detailed wiring process (S105) are carried out to then complete the layout. Japanese Laid Open Patent Application (JP-A-Heisei, 10-340959) also discloses a layout method which after the arrangement of the hard macro (S101), removes the terminal and the wiring within the hard macro and then generates a hard macro terminal.

In addition, in a semiconductor apparatus, there may be a case that a bypass capacitor is mounted between a power supply line and a ground line in order to suppress a noise. In this case, the bypass capacitor is manually arranged after the automatic layout. Thus, enormous labor is necessary for the arrangement of the bypass capacitor.

It is desirable to develop a method for arranging the bypass capacitor without requiring the enormous labor.

Also, a semiconductor apparatus having a bypass capacitor is disclosed in Japanese Laid Open Patent Application (JP-A-Heisei, 10-284605). This known semiconductor apparatus having the bypass capacitor is provided with cell rows 101a, 101b and 101c, as shown in FIG. 2. The cell rows 101a, 101b include a feed through cell 102. The feed through cell 102 is also referred to as a width alignment cell. Its role is to align the widths of the cell rows 101a, 101b and 101c. Also, the feed through cell 102 is designed such that a wiring area can be reserved.

FIG. 3 shows a structure of the feed through cell 102. In FIG. 3, 103 denotes a silicon substrate. 104 denotes an inter-layer film formed on the silicon substrate 103. 105 denotes a first electrode formed on the inter-layer film 104. 106 denotes a second electrode which is formed on its dielectric film 107 so as to be located opposite to the first electrode 105 and constitutes a capacitance together with the first electrode 105 and the dielectric film 107. 108 denotes a first insulation oxide film formed on the second electrode 106. 109 denotes a second insulation oxide film formed on the first insulation oxide film 108. 110 denotes a power source wiring connected to the second electrode 106 through a contact hole 111 by using a first layer wiring. And, 112 denotes a ground wiring connected to the first electrode 105 through a contact hole 113 by using the first layer wiring.

The known semiconductor apparatus having the bypass capacitor uses the space between the first electrode 105 and the second electrode 106 as capacitance. The semiconductor apparatus is desirable which has the bypass capacitor in which the space is effectively used. At this time, it is further desirable that the bypass capacitor mounted in the semiconductor apparatus can have a structure for making an automatic design easy.

Japanese Laid Open Patent Application (JP-A-Heisei, 5-283615) discloses a power supply wiring of a semiconductor integrated circuit as described below. In order to effectively reduce a noise induced in a power supply of LSI, in the LSI having a Vcc power supply/GND wiring with two or more layers and two or more rows, one Vcc power supply wiring is arranged in an upper layer, and a GND wiring is arranged in a lower layer. In rows adjacent to each other, a Vcc power supply wiring is arranged in a lower layer, and a GND wiring is arranged in an upper layer.

Japanese Laid Open Patent Application (JP-A-Heisei, 11-204766) discloses a method for designing a semiconductor integrated circuit as described below. This is a method for designing a semiconductor integrated circuit including a plurality of basic cells, a power supply line and a ground line placed over those basic cells, and a plurality of bypass capacitors electrically connected to the power supply line and the ground line. This carries out the layouts of the plurality of basic cells, the power supply line and the ground line, and after tentatively setting the sizes of the respective bypass capacitors and the arrangement intervals of the bypass capacitors, respectively places the respective bypass capacitors, in which the sizes and the arrangement intervals are tentatively set, in empty areas of the basic cells in accordance with the layout, and if obtaining the desirable arrangement of the bypass capacitors, determines its arrangement as the final arrangement, and on the other hand, if failing in the desirable arrangement of the bypass capacitors, repeats the procedure for again setting the sizes of the bypass capacitors and the arrangement intervals between them and again placing the respective bypass capacitors until obtaining the desirable arrangement of the bypass capacitors.

Japanese Laid Open Patent Application (JP-A-Heisei, 11-233636) discloses a semiconductor integrated circuit as described below. A macro cell, which has a pad portion that is placed in an area around a chip and is intended to input and output a signal from or to an external portion of the chip, and a function area mounted in an entirely inner area of the chip except the pad portion and is configured so as to have at least a desirable function in advance, and an input/output buffer for sending to the function area a signal inputted to or outputted from the external portion of the chip through the pad portion are placed at any position within the function area.

SUMMARY OF THE INVENTION

The present invention is accomplished in view of the above mentioned problems. Therefore, an object of the present invention is to provide a semiconductor apparatus including a bypass capacitor having a structure that makes automatic design easy. Another object of the present invention is to provide a semiconductor apparatus having a bypass capacitor in which space is effectively used. Still another object of the present invention is to provide a layout method that can make a layout of a semiconductor apparatus having a bypass capacitor easy.

In order to achieve an aspect of the present invention, a semiconductor apparatus, includes: a semiconductor substrate; a first wiring provided in the semiconductor substrate; a second wiring provided in the semiconductor substrate; and a capacitance cell, and wherein the capacitance cell includes a bypass capacitor connecting the first wiring to the second wiring.

In this case, the capacitance cell is provided to overlap with the first and second wirings.

In order to achieve another aspect of the present invention, a semiconductor apparatus, includes: a semiconductor substrate; a function region provided in the semiconductor substrate, a predetermined function being performed in the function region; a first wiring provided in the semiconductor substrate; and a second wiring provided in the semiconductor substrate, and wherein the function region includes: a circuit cell having a circuit; and a capacitance cell, and wherein the capacitance cell includes a bypass capacitor connecting the first wiring to the second wiring and the capacitance cell is arranged in a region where the circuit cell does not exist.

In this case, the capacitance cell occupies an entire portion other than the circuit cell of the function region.

Also in this case, the capacitance cell is arranged in a portion where the function region overlaps with the first and second wirings.

Further in this case, the capacitance cell is selected of a plurality of capacitance cells having different shapes with each other based on a shape of the circuit cell.

In this case, the bypass capacitor includes a first electrode section connected electronically to the first wiring, and the first electrode section is opposed to the second wiring.

Also in this case, the first electrode section includes two electrodes connected to the first wiring, and one electrode of the two electrodes is opposed to a surface in a side of the semiconductor substrate of surfaces of the second wiring, and the other electrode of the two electrodes is opposed to another surface in the other side of the semiconductor substrate of the surfaces of the second wiring.

Further in this case, the bypass capacitor further includes a second electrode electronically connected to the second wiring, and the second electrode is opposed to the first electrode.

In this case, the bypass capacitor further includes a third electrode connected to the first wiring, and the third electrode is opposed to the second electrode.

Also in this case, the function region is an I/O region, and the circuit cell is an I/O cell inputting a signal from an external portion of the semiconductor apparatus and outputting another signal to the external portion.

Further in this case, a portion opposed to the second wiring of the first electrode section extends in the same direction as an extending direction of the second wiring.

In this case, the bypass capacitor further includes a fourth electrode connected to the second wiring, and the fourth electrode is opposed to the first wiring.

Also in this case, a portion opposed to the first wiring of the fourth electrode extends in the same direction as an extending direction of the first wiring.

Further in this case, the bypass capacitor further includes: a first connection section connecting the first electrode section to the first wiring; and a second connection section connecting the fourth electrode to the second wiring, and wherein the first connection section extends in a depth direction of the semiconductor substrate from the first wiring, and wherein the second connection section extends in the depth direction of the semiconductor substrate from the second wiring, and wherein a third wiring passes between the first and second connection sections.

In this case, a first conductive type of a first semiconductor region is formed in a portion included in the function region of a surface portion of the semiconductor substrate, and wherein the bypass capacitor further includes a fifth electrode connected to the first wiring, and wherein the first semiconductor region is opposed to the fifth electrode.

Also in this case, a second conductive type of a second semiconductor region is formed in the portion included in the function region of the surface portion of the semiconductor substrate, the second conductive type being different from the first conductive type, and wherein the bypass capacitor further includes a sixth electrode connected to the second wiring, and wherein the second semiconductor region is opposed to the sixth electrode.

Further in this case, the first and second wirings extend in a first direction parallel to the surface portion, and wherein the first and second semiconductor regions in parallel are provided between the first and second wirings, and wherein the fifth electrode extends in a second direction which is normal to the first direction and is parallel to the surface portion from the first wiring to cross the second semiconductor region and a portion opposite to the first semiconductor region of the fifth electrode extends in the first direction.

In this case, the sixth electrode extends in a direction which is normal to the first direction and is parallel to the surface portion from the second wiring to cross the first semiconductor region and a portion opposite to the second semiconductor region of the sixth electrode extends in the first direction.

Also in this case, the function region is an inner primitive region, and the circuit cell is a basic cell indicating a region in which a predetermined circuit is mounted.

In order to achieve still another aspect of the present invention, a semiconductor apparatus layout method, includes: (a) arranging a first and second wirings on a semiconductor substrate; and (b) providing a capacitance cell, and wherein the capacitance cell includes a bypass capacitor connecting the first wiring to the second wiring.

In this case, the capacitance cell is provided to overlap with the first and second wirings.

In order to achieve yet still another aspect of the present invention, a semiconductor apparatus layout method, includes: (a) arranging a circuit cell in a function region provided in a semiconductor substrate, wherein the circuit cell is cell indicating a region in which a circuit is mounted; (b) arranging first and second wirings on the semiconductor substrate; and (c) arranging a capacitance cell in a region where the circuit cell does not exist of the function region, and wherein the capacitance cell is a cell indicating a region in which a bypass capacitor is mounted, the bypass capacitor being electronically connected to a power supply wiring and a grounded wiring.

In this case, the (c) includes arranging the capacitance cell to overlap with the first and second wirings.

Also in this case, the (c) includes arranging the capacitance cell in an entire region where the circuit cell does not exist.

Further in this case, the capacitance cell is selected of a plurality of capacitance cells having different shapes with each other based on a shape of the circuit cell.

In this case, the function region is an I/O region and the circuit is an I/O buffer.

Also in this case, the function region is an inner primitive region and the circuit cell is a basic cell indicating a region in which a predetermined circuit is mounted.

In order to achieve still another aspect of the present invention, a semiconductor apparatus layout method, includes: (d) arranging an I/O cell in an I/O region; (e) arranging a first capacitance cell in a portion where the I/O cell does not exist of the I/O region, wherein the first capacitance cell is a cell indicating a region in which a first bypass capacitance is mounted; (f) providing a power supply wiring and a grounded wiring, wherein the power supply wiring and the grounded wiring are electronically connected to the first bypass capacitance; (g) arranging a second capacitance cell in a region where an inner primitive region overlaps with the power supply wiring and the grounded wiring, wherein the second capacitance cell is a cell indicating a region in which a second bypass capacitance is mounted; (h) arranging a basic cell in the inner primitive region, wherein the basic cell is a cell indicating a region in which a predetermined circuit is mounted; and (i) arranging a third capacitance cell in a region where the basic cell and the second capacitance cell do not exist of the inner primitive region, wherein the third capacitance cell is a cell indicating a region in which a third bypass capacitance is mounted.

In order to achieve still another aspect of the present invention, a computer readable recording medium for recording a program for a process, includes: (a) arranging a first and second wirings on a semiconductor substrate; and (b) providing a capacitance cell, and wherein the capacitance cell includes a bypass capacitor connecting the first wiring to the second wiring.

In this case, the capacitance cell is provided to overlap with the first and second wirings.

In order to achieve yet still another aspect of the present invention, a computer readable recording medium for recording a program for a process, includes: (a) arranging a circuit cell in a function region provided in a semiconductor substrate, wherein the circuit cell is a cell indicating a region in which a circuit is mounted; (b) arranging first and second wirings on the semiconductor substrate; and (c) arranging a capacitance cell in a region where the circuit cell does not exist of the function region, and wherein the capacitance cell is a cell indicating a region in which a bypass capacitor is mounted, the bypass capacitor being electronically connected to a power supply wiring and a grounded wiring.

In this case, the (c) includes arranging the capacitance cell to overlap with the first and second wirings.

Also in this case, the (c) includes arranging the capacitance cell in an entire region where the circuit cell does not exist.

Further in this case, the capacitance cell is selected of a plurality of capacitance cells having different shapes with each other based on a shape of the circuit cell.

In order to achieve yet still another aspect of the present invention, a computer readable recording medium for recording a program for a process, includes: (d) arranging an I/O cell in an I/O region; (e) arranging a first capacitance cell in a portion where the I/O cell does not exist of the I/O region, wherein the first capacitance cell is a cell indicating a region in which a first bypass capacitance is mounted; (f) providing a power supply wiring and a grounded wiring, wherein the power supply wiring and the grounded wiring are electronically connected to the first bypass capacitance; (g) arranging a second capacitance cell in a region where an inner primitive region overlaps with the power supply wiring and the grounded wiring, wherein the second capacitance cell is a cell indicating a region in which a second bypass capacitance is mounted; (h) arranging a basic cell in the inner primitive region, wherein the basic cell is a cell indicating a region in which a predetermined circuit is mounted; and (i) arranging a third capacitance cell in a region where the basic cell and the second capacitance cell do not exist of the inner primitive region, wherein the third capacitance cell is a cell indicating a region in which a third bypass capacitance is mounted.

DESCRIPTION OF THE PREFERRED EMBODIMENTS

Preferred embodiments of the present invention will be described referring to the relevant drawings.

Figure 1:
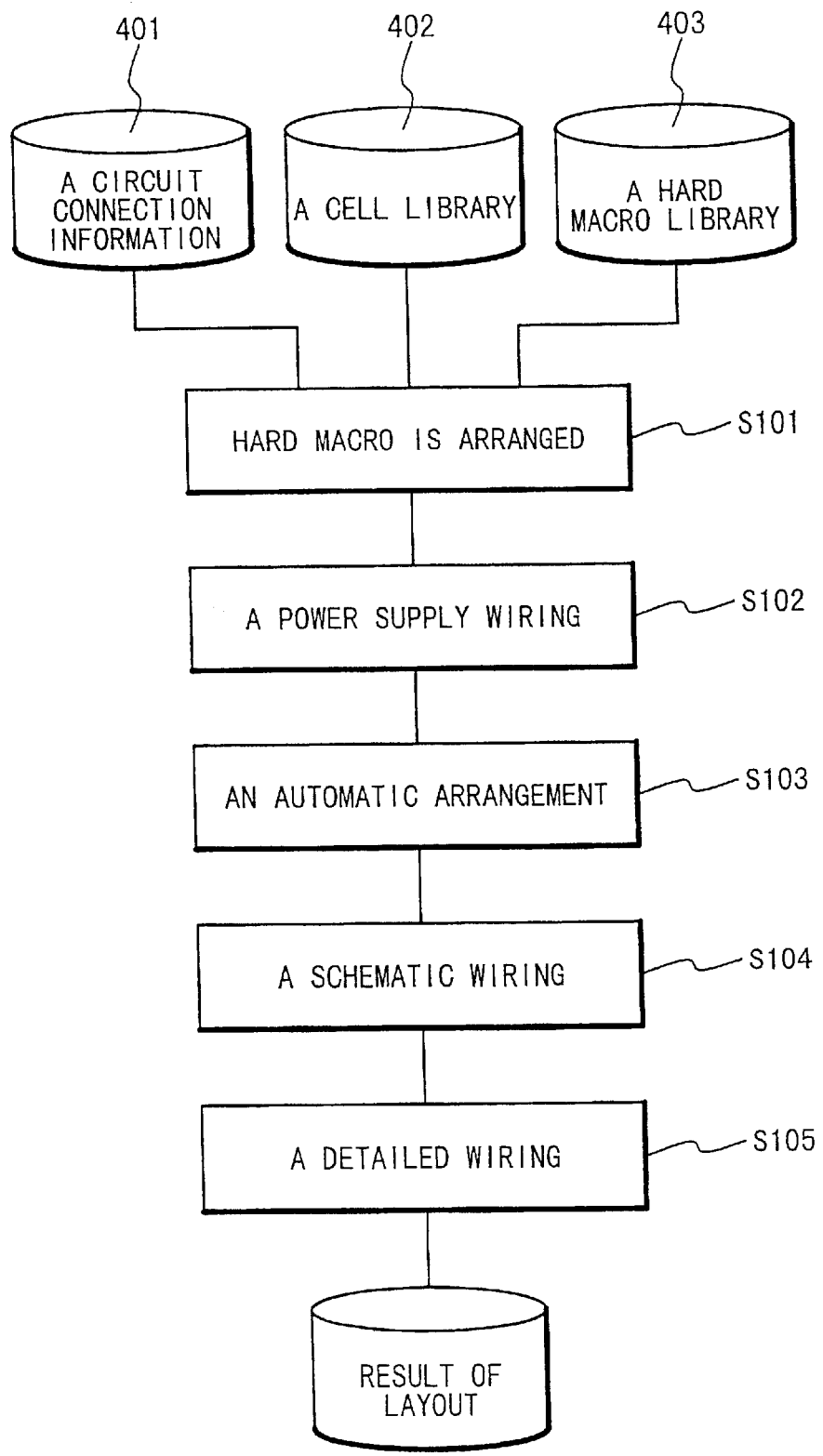
FIG. 1 is a flowchart showing a process of a conventional semiconductor apparatus layout method.
Figure 2:
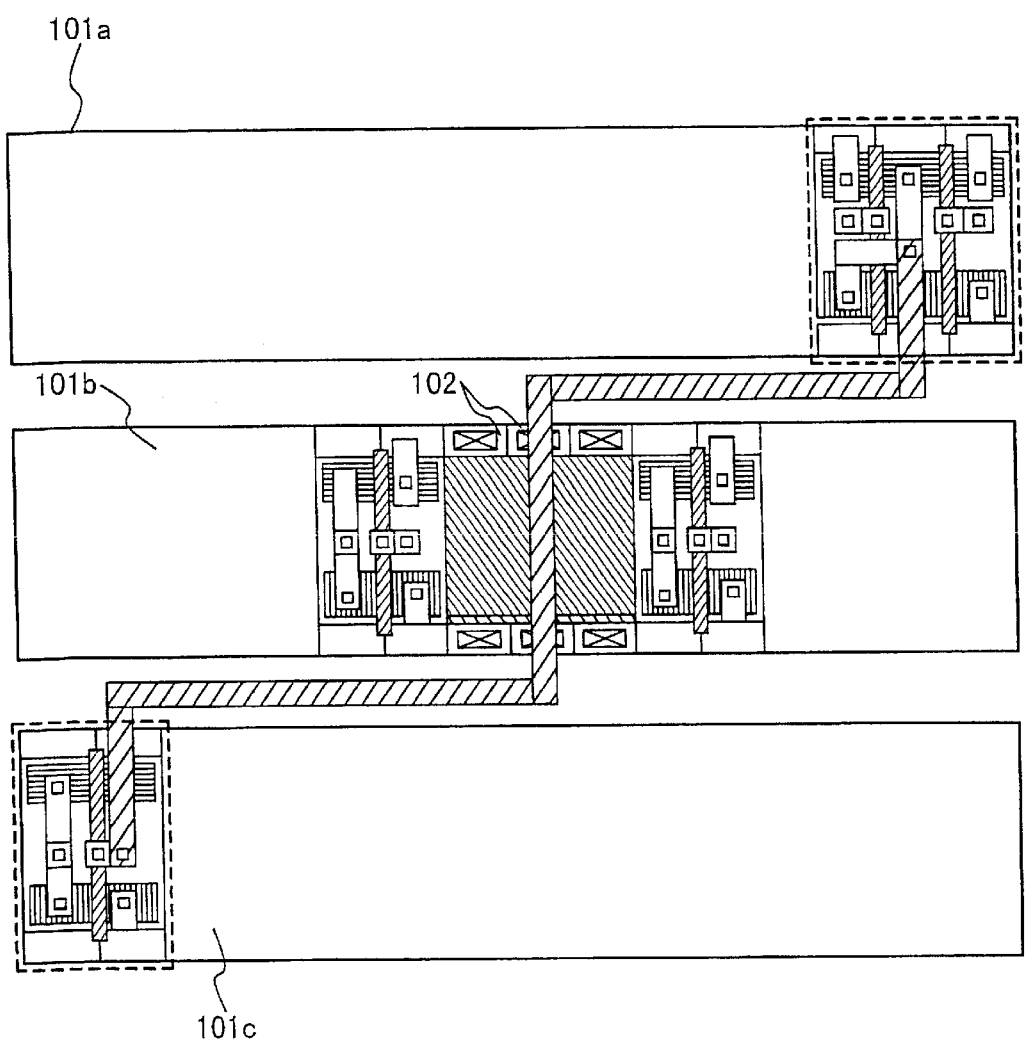
FIG. 2 is a plan view showing a structure of a conventional semiconductor apparatus.
Figure 3:
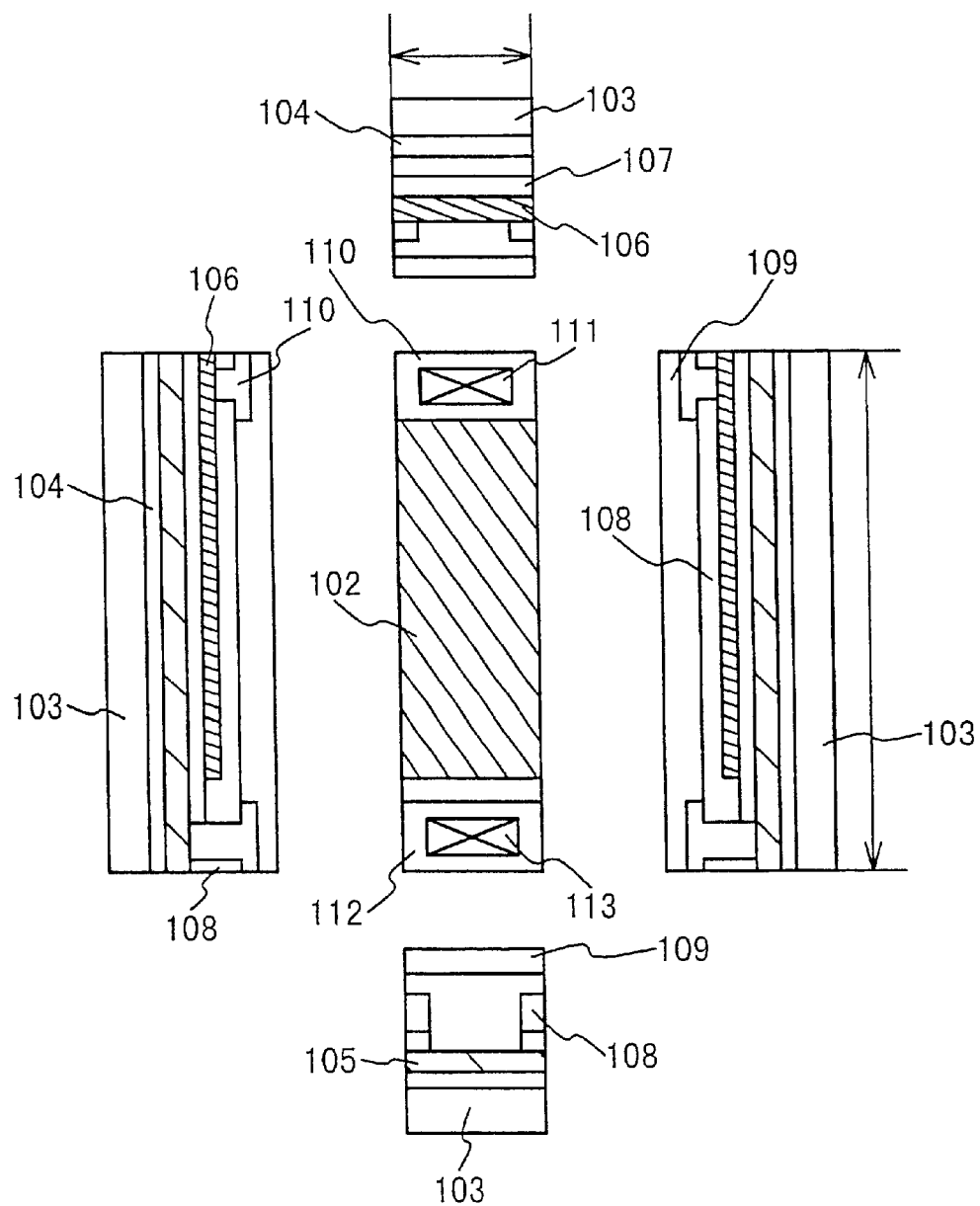
FIG. 3 is a section view showing a structure of a conventional semiconductor apparatus.
Figure 4:
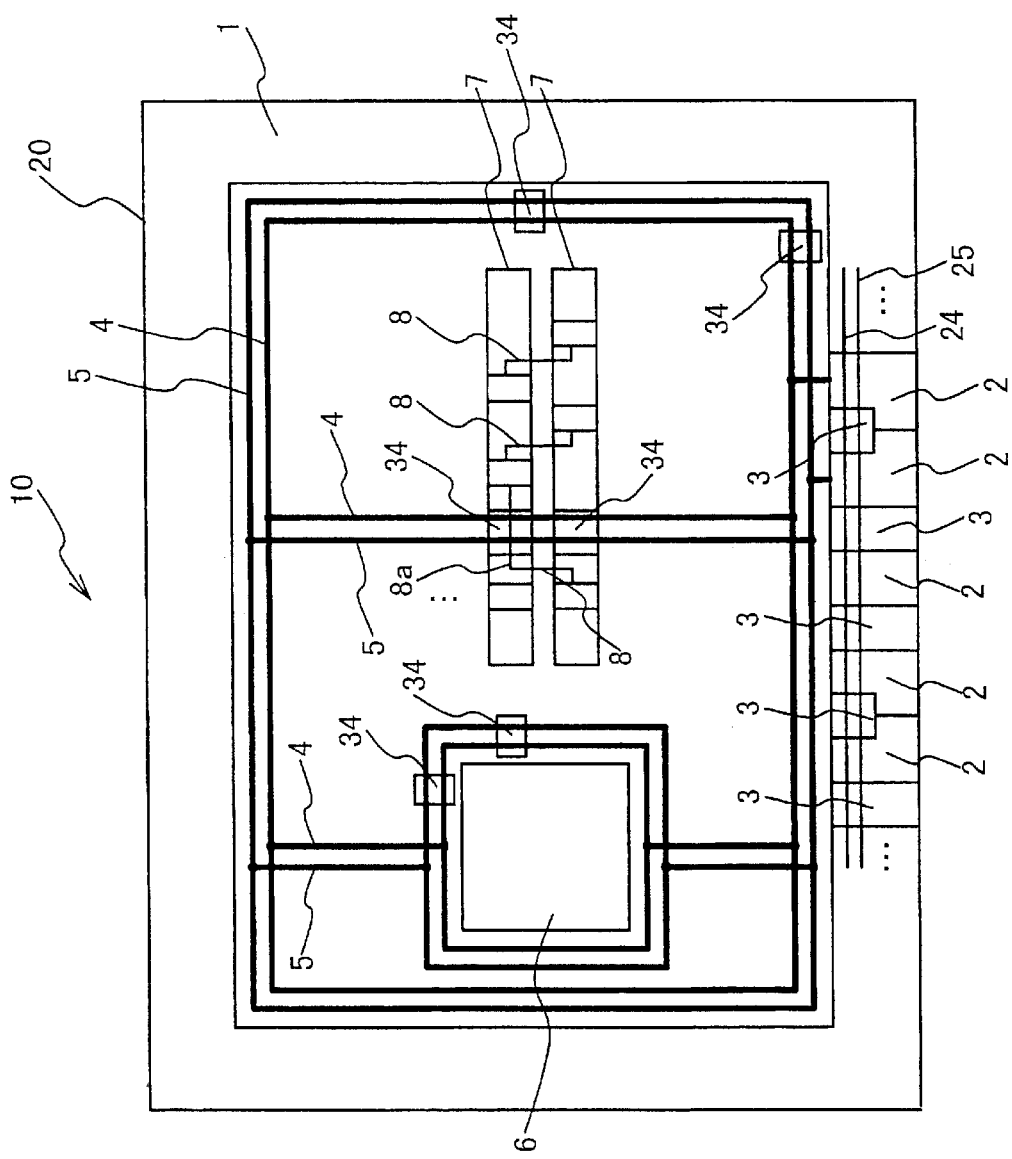
FIG. 4 is a plan view showing a configuration of a semiconductor apparatus of a first embodiment of the present invention.
Figure 5:
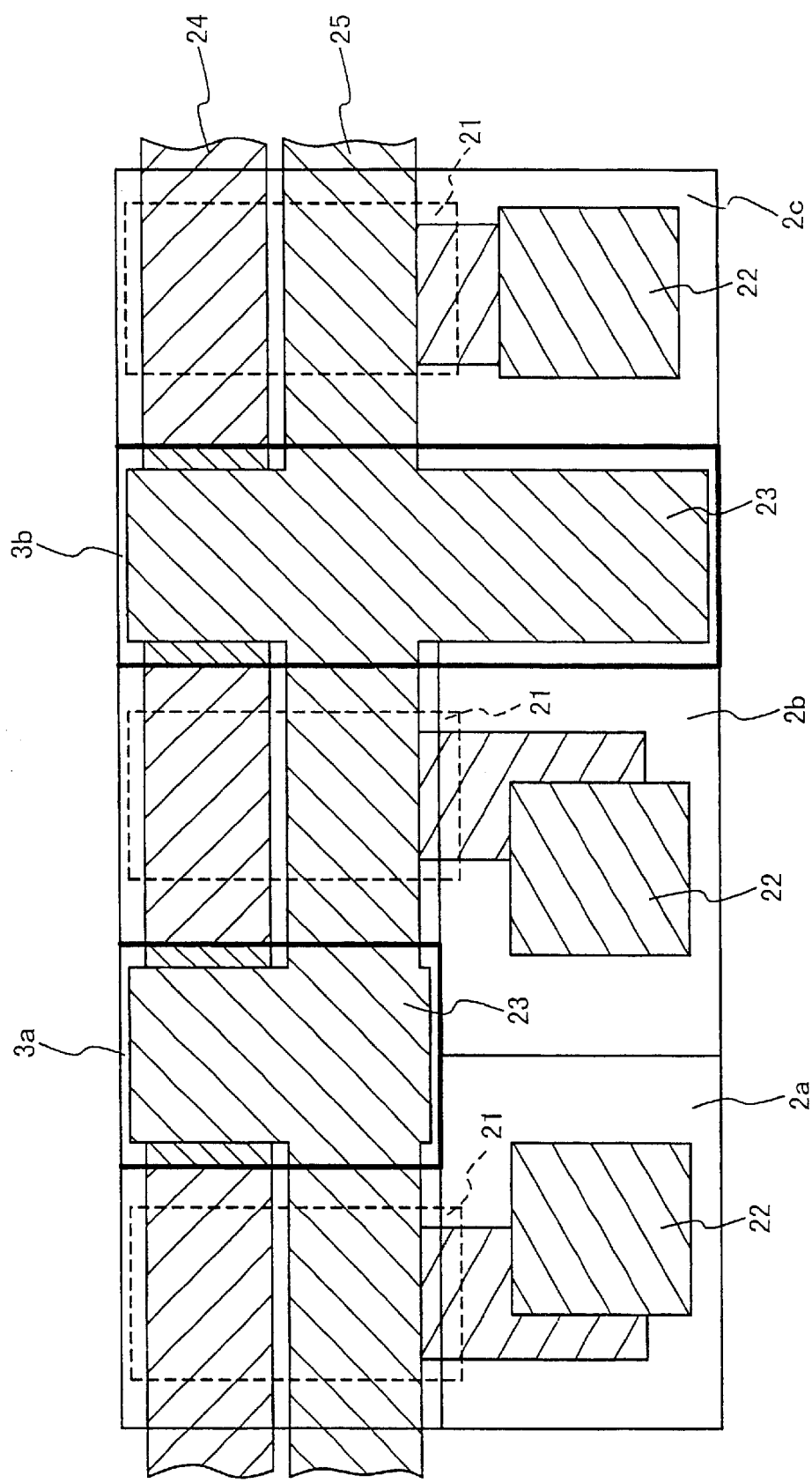
FIG. 5 is a plan view showing a configuration of an I/O area of the first embodiment of the present invention.

A first embodiment of a semiconductor apparatus according to the present invention has a semiconductor substrate. An I/O area is formed on a semiconductor substrate 20, as shown in FIG. 4. An I/O cell 2 is formed in an I/O area 1. However, FIG. 4 shows only a part of the I/O cell 2. The I/O cell 2 is an area in which an input/output buffer 21 and a pad 22 are formed, as shown in FIG. 5.

A buffer capacitance cell 3 is further formed in the I/O area 1. The buffer capacitance cell 3 is an area in which an I/O area bypass capacitor 23 is placed. The buffer capacitance cells 3 are placed in all portions having no I/O cell 2, in the I/O area 1. However, FIG. 4 shows only a part of the formed buffer capacitance cell 3. The structure of the I/O area bypass capacitor 23 will be described later.

A power supply line 24 and a ground line 25 are placed in the I/O area 1. The power supply line 24 and the ground line 25 are placed such that they cross the I/O cell 2 and the buffer capacitance cell 3. The power supply line 24 and the ground line 25 supply the electric power to the input/output buffer 21 in the I/O cell 2. Also, the power supply line 24 and the ground line 25 are connected to the I/O area bypass capacitor 23 in the buffer capacitance cell 3.

A power supply wiring 4 and a ground wiring 5 extend into the inside of the semiconductor apparatus 10. Also, the power supply wiring 4 and the ground wiring 5 wrap round the inside of the semiconductor chip 20 while they are in contact with the inside of the I/O area 1. The power supply wiring 4 and the ground wiring 5 supply the electric power to the respective portions of the semiconductor apparatus 10. A power supply line capacitance cell 34 is formed such that it overlaps with the power supply wiring 4 and the ground wiring 5. The power supply line capacitance cells 34 are formed all the portions where the power supply wiring 4 and the ground wiring 5 are placed. However, only a part thereof is shown in FIG. 4.

A hard macro 6 is placed in contact with the power supply wiring 4 and the ground wiring 5. The hard macro 6 is an area in which a large circuit having a certain function is accommodated. For example, a RAM, a ROM and a calculator are accommodated in the hard macro 6. The power supply wiring 4 and the ground wiring 5 wrap round the periphery of the hard macro 6. The power supply line capacitance cell 34 is also formed such that it overlaps with the portion in which the power supply wiring 4 and the ground wiring 5 wrap round the periphery of the hard macro 6.

Figure 6:
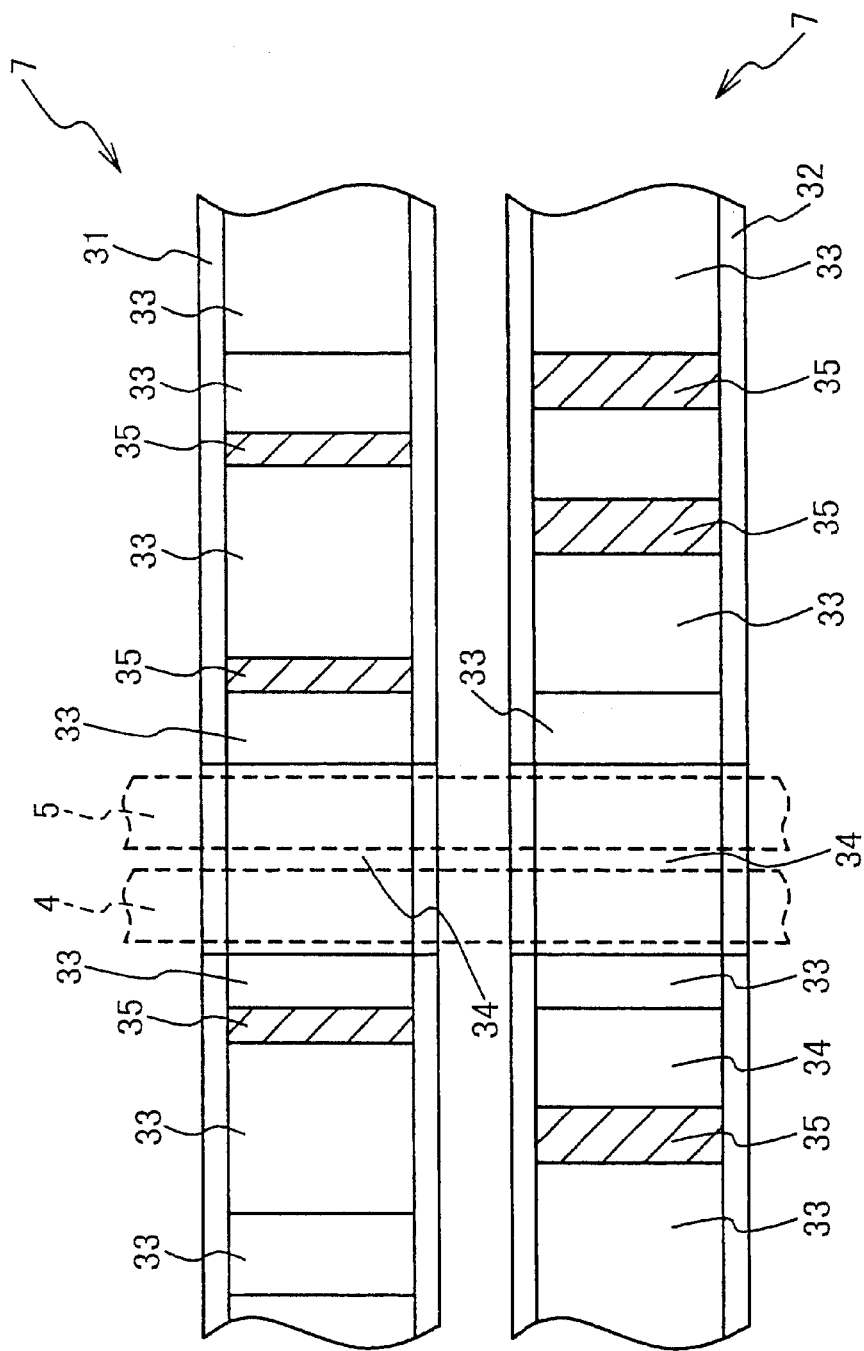
FIG. 6 is a plan view showing a configuration of an inner primitive area of the first embodiment of the present invention.

The power supply wiring 4 and the ground wiring 5 further cross an inner primitive area 7. The inner primitive area 7 is placed in the entire portion inside the I/O area in the semiconductor apparatus 10. However, only a part thereof is shown. A power supply line 31 and a ground line 32 are placed in the inner primitive area 7, as shown in FIG. 6. The power supply line 31 is connected to the power supply wiring 4. The ground line 32 is connected to the ground wiring 5. A basic cell 33 serving as a function block having a peculiar function is placed in the inner primitive area 7. Circuits, for example, a flip-flop, an inverter and the like are accommodated in each basic cell 33.

The power supply line capacitance cell 34 is placed in the portion in which the power supply wiring 4 and the ground wiring 5 overlap with each other, in the inner primitive area 7. The power supply line capacitance cells 34 are placed in all the portions in which the power supply wiring 4 and the ground wiring 5 overlap with each other, in the inner primitive area 7.

Figure 7:
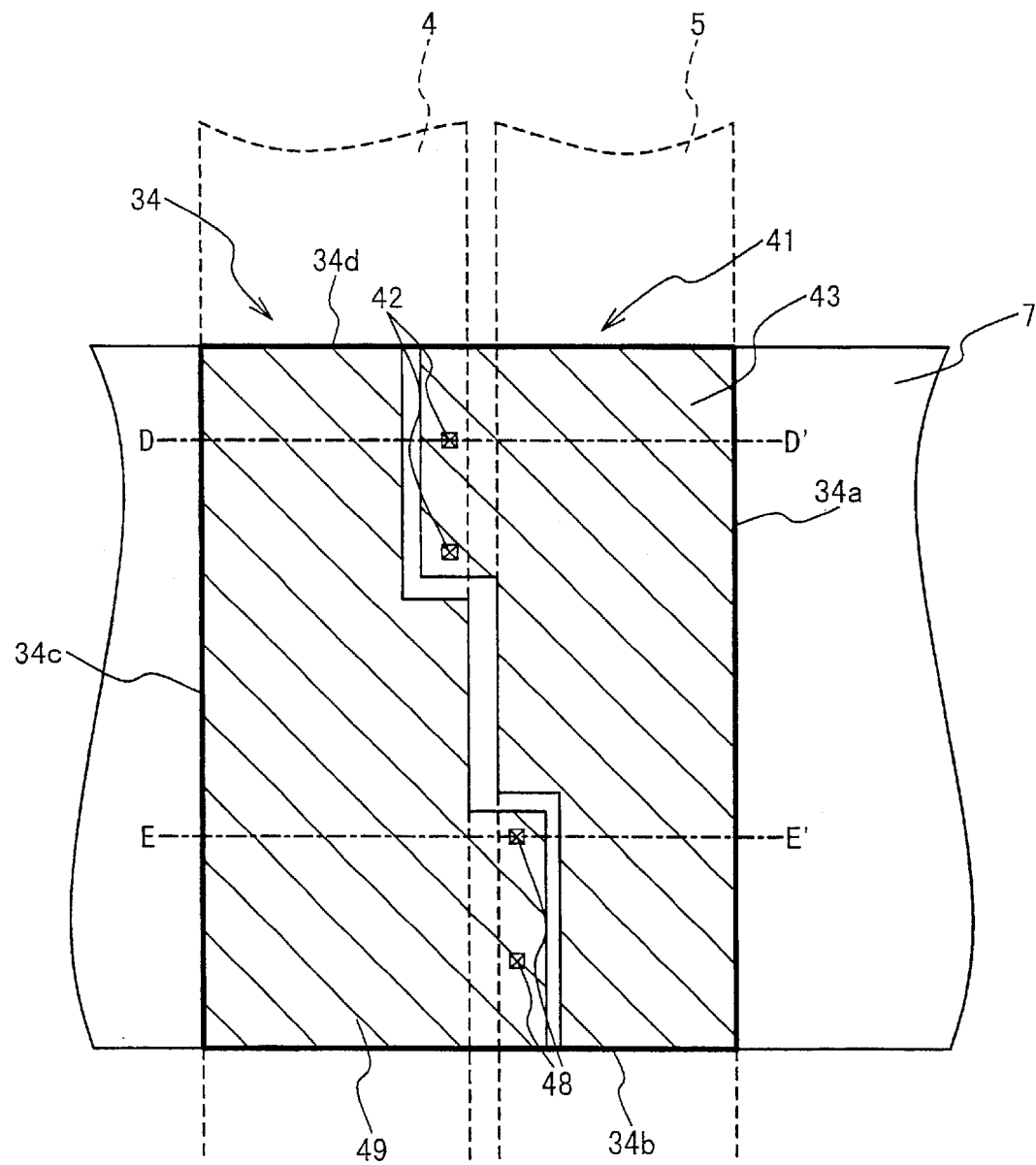
FIG. 7 is a plan view showing a configuration of a power supply line capacitance cell and a power supply line bypass capacitor of the first embodiment of the present invention.

A power supply line bypass capacitor 41 is accommodated in each power supply line capacitance cell 34, as shown in FIG. 7. The power supply line bypass capacitor 41 is connected to the power supply wiring 4 and the ground wiring 5. The structure of the power supply line bypass capacitor 41 will be described later.

Figure 8:
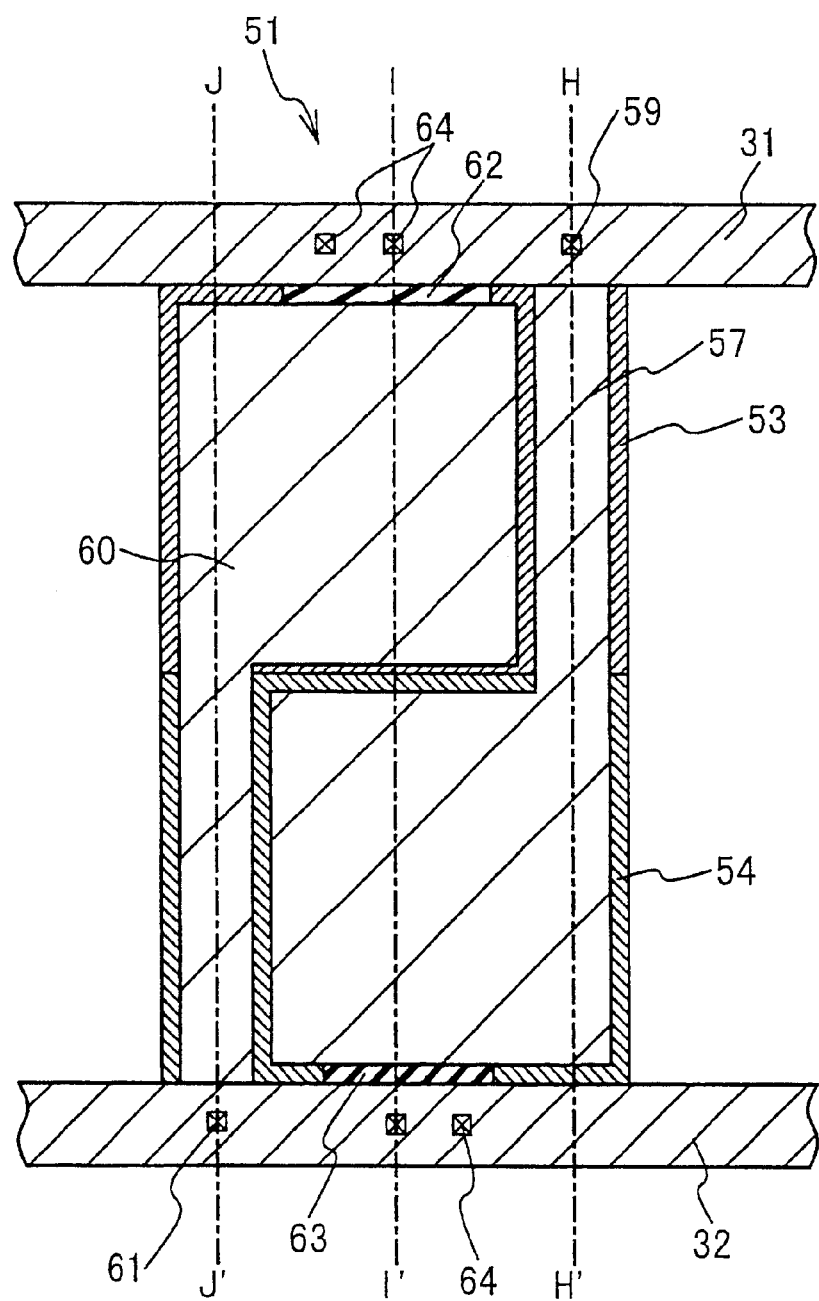
FIG. 8 is a plan view showing a configuration of an inner primitive area capacitance cell and an inner primitive bypass capacitor of the first embodiment of the present invention.

As shown in FIG. 6, an inner primitive area capacitance cell 35 is placed in the portion in which the basic cell 33 and the power supply line capacitance cell 34 are not placed, in the inner primitive area 7. An inner primitive area bypass capacitor 51 is accommodated in the inner primitive area 7, as shown in FIG. 8. The inner primitive area capacitance cells 35 are placed in all the portions in which the basic cell 33 and the power supply line capacitance cell 34 are not placed, in the inner primitive area 7. The structure of the inner primitive area bypass capacitor 51 will be described later.

Moreover, a wiring 8 is placed such that it is connected to the hard macro 6, the basic cell 33 and the I/O area 1. FIG. 4 shows only a part of the formed wiring 8. A signal is sent through the wiring 8 to thereby attain a desirable function.

In addition, the semiconductor apparatus of the first embodiment may be designed so as to remove one or two of the buffer capacitance cell 3, the power supply line capacitance cell 34 and the inner primitive area capacitance cell 35.

Figure 9:
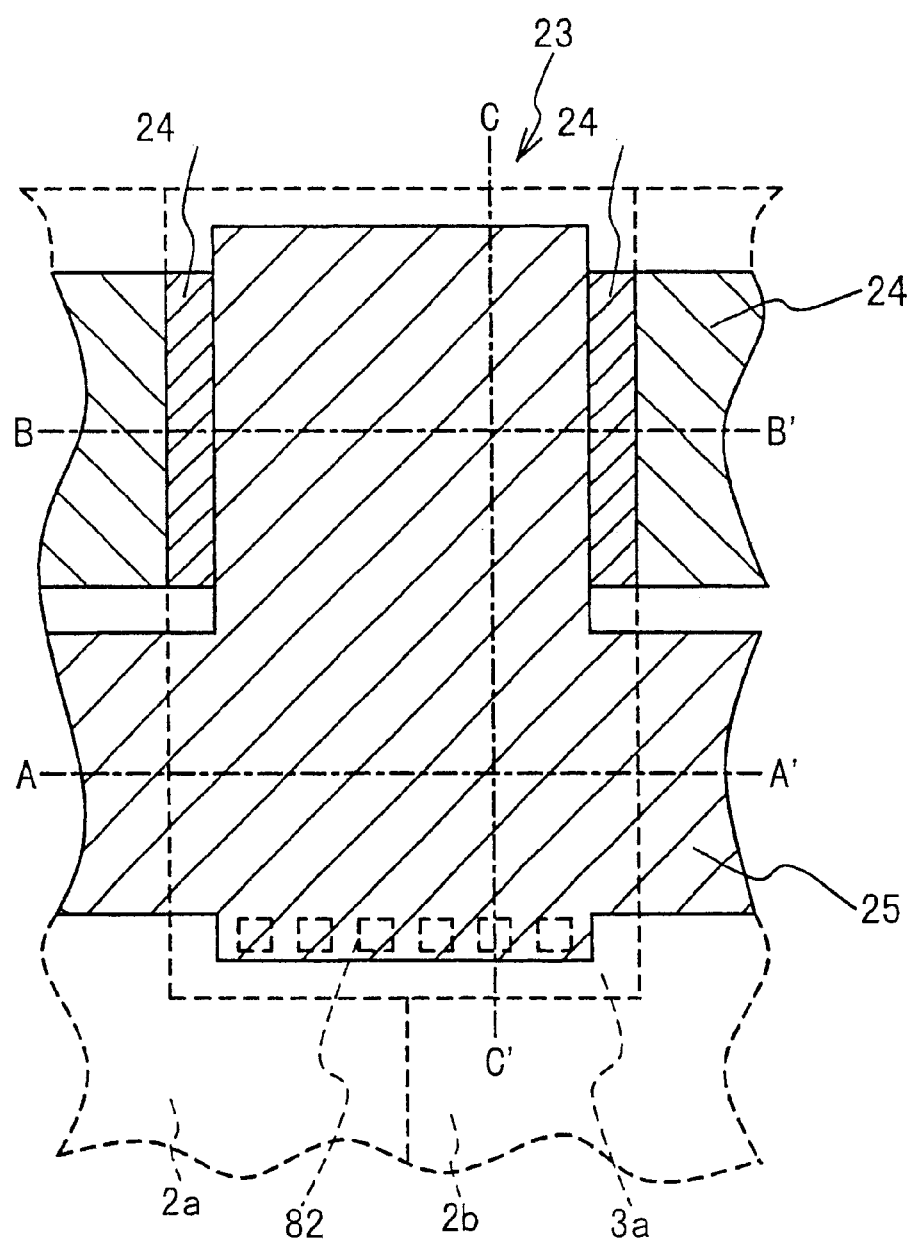
FIG. 9 is a plan view showing a configuration of an I/O area bypass capacitor of the first embodiment of the present invention.
Figure 10:
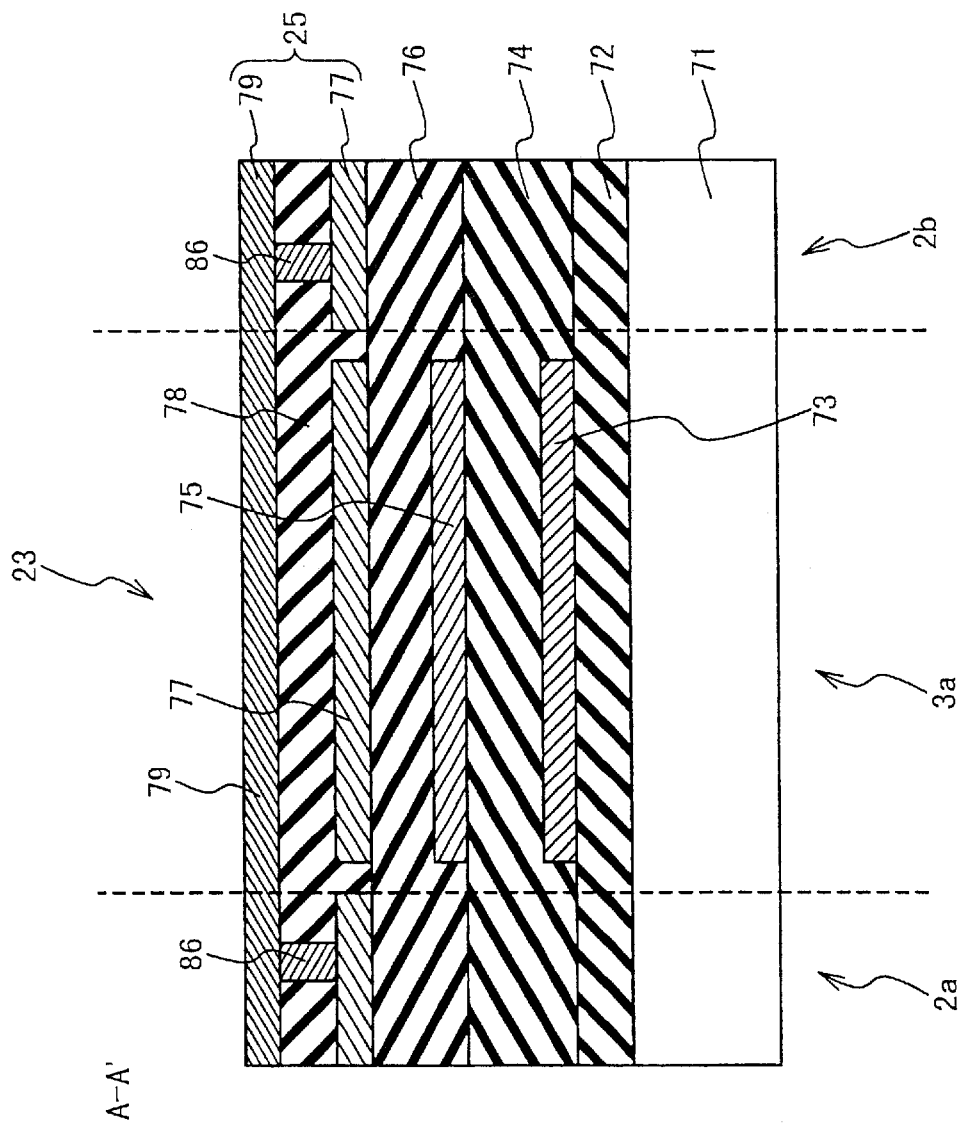
FIG. 10 is a section view showing a structure taken on a section A–A' of the I/O area bypass capacitor of the first embodiment of the present invention.
Figure 11:
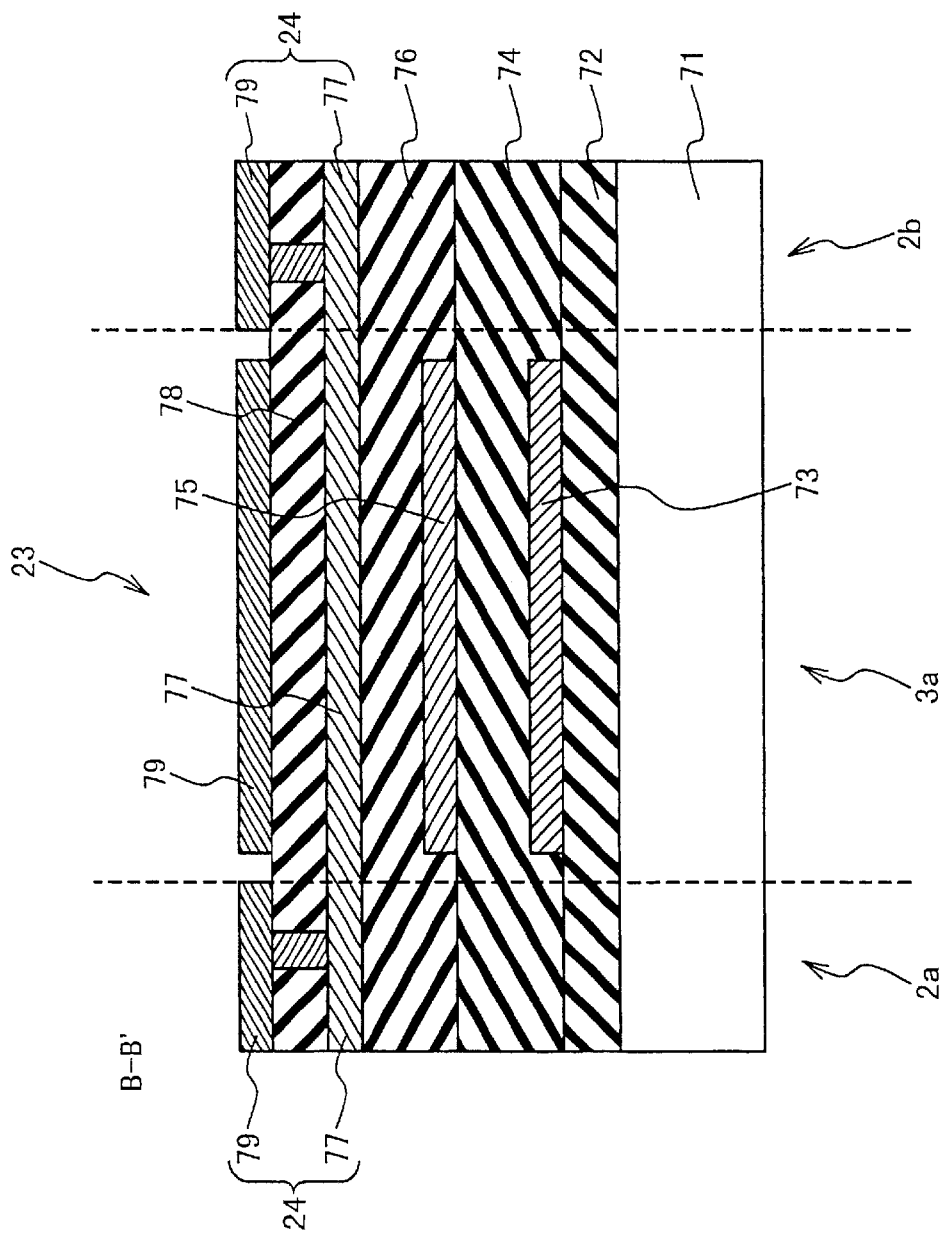
FIG. 11 is a section view showing a structure taken on a section B–B' of the I/O area bypass capacitor of the first embodiment of the present invention.
Figure 12:
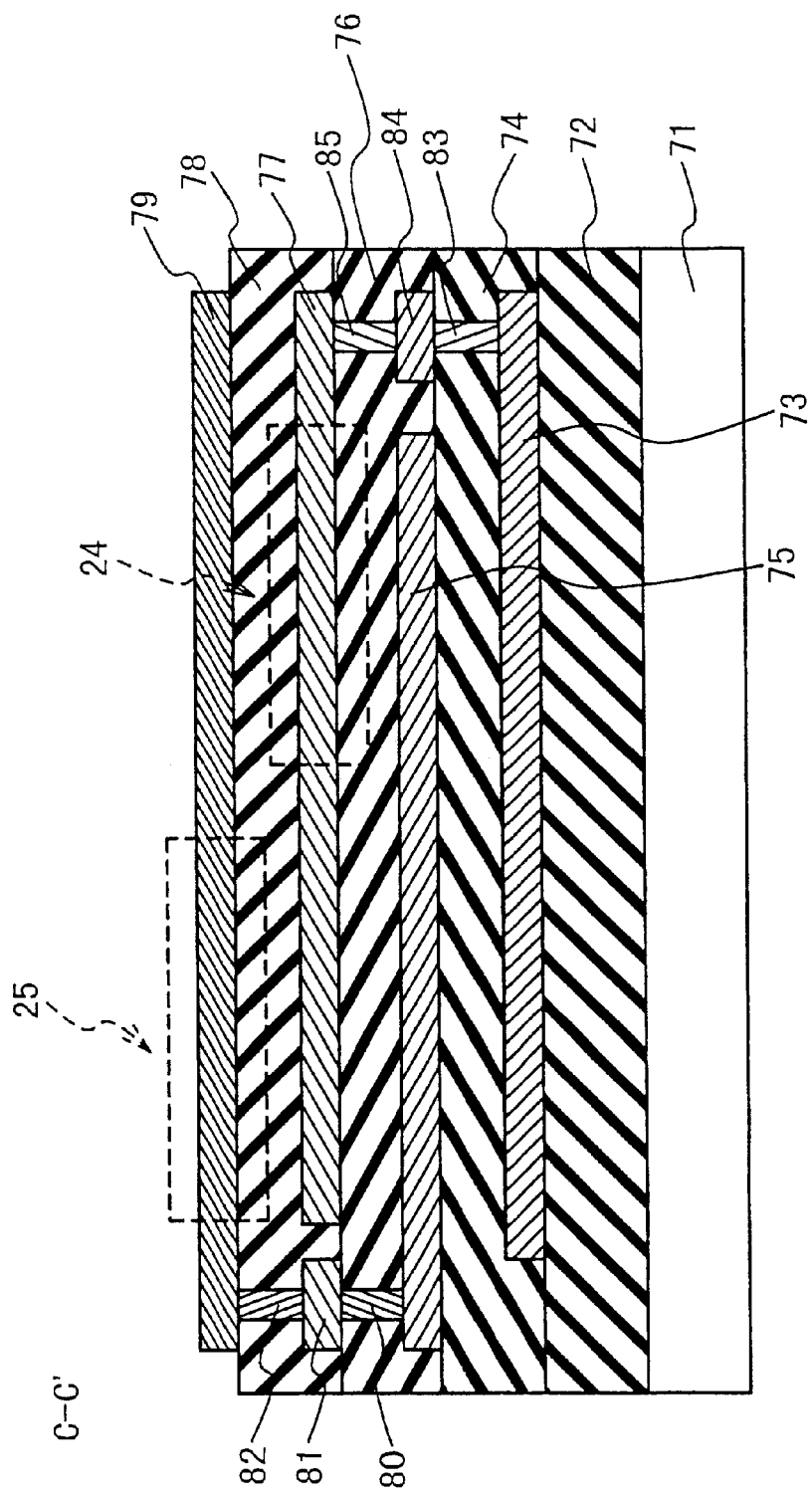
FIG. 12 is a section view showing a structure taken on a section C–C' of the I/O area bypass capacitor of the first embodiment of the present invention.

The structure of the I/O area bypass capacitor 23 will be described below with reference to FIGS. 9 to 12. FIG. 9 is a plan view showing the structure of the I/O area bypass capacitor 23. FIGS. 10 to 12 are the section views showing the structure of the I/O area bypass capacitor 23.

As shown in FIGS. 10 to 12, the I/O area bypass capacitor 23 is formed on a semiconductor substrate 71. A first insulation layer 72 is formed on the semiconductor substrate 71. A polysilicon layer 73 is formed on the first insulation layer 72. The polysilicon layer 73 serves as one electrode among electrodes of the I/O area bypass capacitor 23.

A second insulation layer 74 is formed on the polysilicon layer 73. A first wiring layer 75 is formed on the second insulation layer 74. The first wiring layer 75 serves as one electrode of the electrodes of the I/O area bypass capacitor 23. A third insulation layer 76 is formed on the first wiring layer 75. A second wiring layer 77 is formed on the third insulation layer 76. The second wiring layer 77 serves as one electrode among the electrodes of the I/O area bypass capacitor 23.

A fourth insulation layer 78 is formed on the second wiring layer 77. A third wiring layer 79 is formed on the fourth insulation layer 78. The third wiring layer 79 serves as one electrode among the electrodes of the I/O area bypass capacitor 23.

As shown in FIGS. 10, 11, the power supply line 24 and the ground line 25 in the I/O cell 2 of the I/O area 1 are constituted by the second wiring layer 77 and the third wiring layer 79. In the area of the I/O cell 2, the second wiring layer 77 and the third wiring layer 79 are connected through a plug 86. On the other hand, in the area of the buffer capacitance cell 3, the power supply line 24 is constituted by the second wiring layer 77. A potential of the second wiring layer 77 is a power supply potential. The ground line 25 is constituted by the third wiring layer 79. A potential of the third wiring layer 79 is a ground potential.

As shown in FIG. 12, a plug 80 is connected to an end of the first wiring layer 75. A land 81 is connected to the plug 80. A plug 82 is connected to the land 81. The plug 82 is connected to the third wiring layer 79. The first wiring layer 75 and the third wiring layer 79 are at the same potential. The first wiring layer 75 is at the power supply potential.

Also as shown in FIG. 12, a plug 83 is connected to an end of the polysilicon layer 73. A land 84 is connected to the plug 83. A plug 85 is connected to the land 84. The plug 85 is connected to the second wiring layer 77. The polysilicon layer 73 and the second wiring layer 77 are at the same potential. The polysilicon layer 73 is at the power supply potential.

The third wiring layer 79 and the second wiring layer 77 are opposite to each other and generate a capacitance. The third wiring layer 79 and the ground line 25 for supplying the ground potential are integrated into a single unit, in the portion in which the I/O area bypass capacitor 23 crosses the ground line 25. The space between the ground line 25 and the second wiring layer 77 are used as the capacitance.

In this specification, the opposition is used as a word implying a positional relation between two conductors. The opposition implies that in planes of the two conductors, the planes having areas wider than the other planes face each other with the insulator between.

The second wiring layer 77 and the first wiring layer 75 are opposite to each other and generate a capacitance. The second wiring layer 77 and the power supply line 24 for supplying the power supply potential are integrated into a single unit, in the portion in which the I/O area bypass capacitor 23 crosses the power supply line 24. Thus, the space between the power supply line 24 and the first wiring layer 75 are also used as the capacitance. The space between the power supply line 24 and the third wiring layer 79 are used as the capacitance, at the same time. That is, both the plane on the substrate side of the power supply line 24 and the plane opposite to the substrate are used as the capacitance.

Also, the first wiring layer 75 and the polysilicon layer 73 are opposite to each other and generate a capacitance. As mentioned above, the entire space between the polysilicon layer 73 and the third wiring layer 79 are used as the capacitance, in the I/O area bypass capacitor 23.

The capacitance can be generated by placing another wiring layer in the I/O area bypass capacitor 23. Also, it may be designed that any of the polysilicon layer 73, the first wiring layer 75, the second wiring layer 77 and the third wiring layer 79 is not used as the capacitance.

Figure 13:
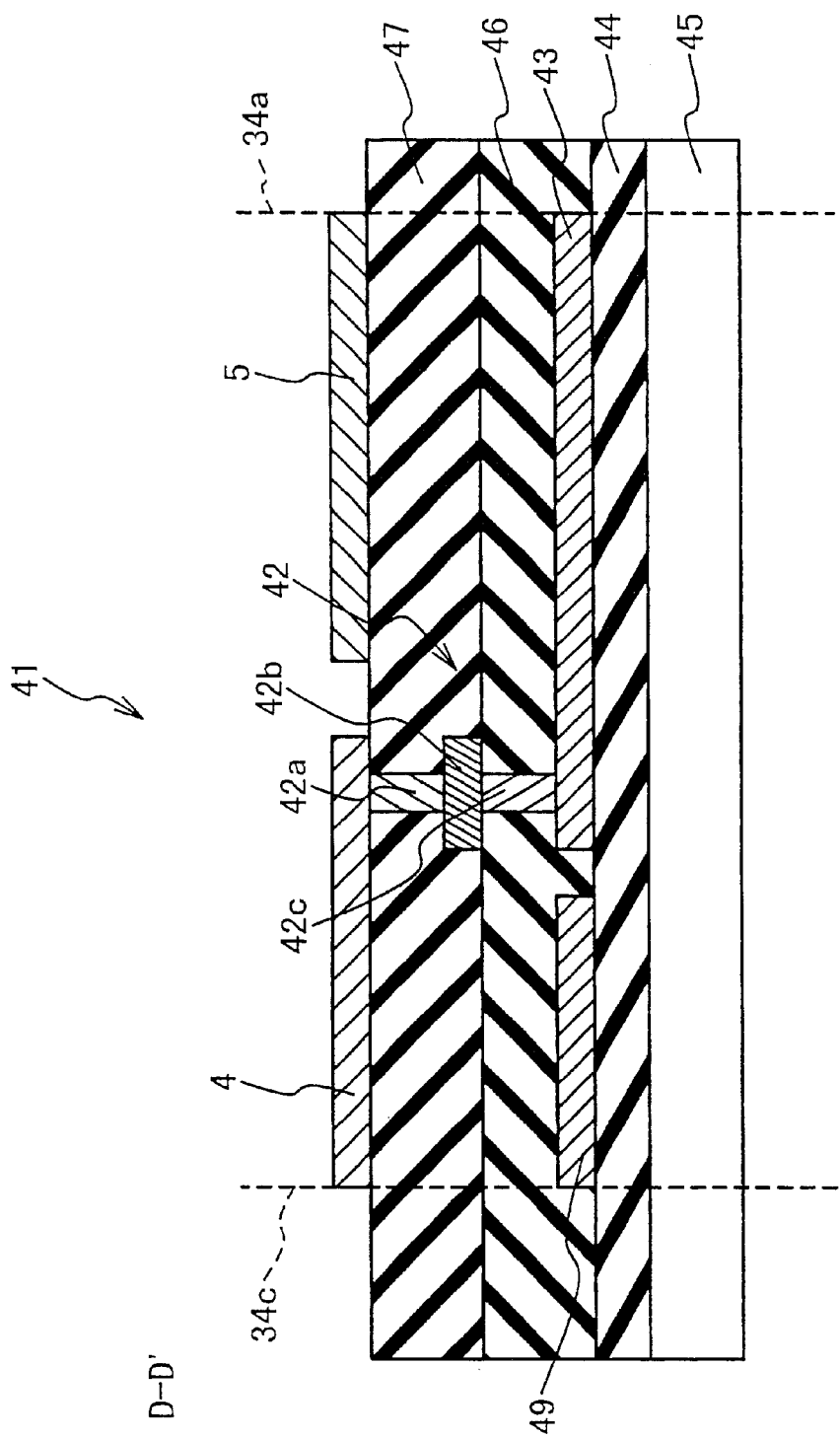
FIG. 13 is a section view showing a structure taken on a section D–D' of the power supply line bypass capacitor of the first embodiment of the present invention.

The structure of the power supply line bypass capacitor 41 will be described below with reference to FIGS. 7, 13 and 14. The power supply line bypass capacitor 41 contains a contact 42. The contact 42 is connected to the power supply wiring 4. As shown in FIG. 13, the contact 42 is composed of a plug 42a, a land 42b and a plug 42c. The contact 42 is connected to a first polysilicon electrode 43.

The first polysilicon electrode 43 is formed on a first insulation film 44. The first insulation film 44 is formed on a semiconductor apparatus 45. A second insulation film 46 and a third insulation film 47 are sandwiched between the first polysilicon electrode 43 and the ground wiring 5. The first polysilicon electrode 43 is opposite to the ground wiring 5. A capacitance is generated in the space in which the first polysilicon electrode 43 and the ground wiring 5 are opposite to each other.

The first polysilicon electrode 43 extends from the contact 42 to a direction of a side on which the ground wiring 5 is present in a direction horizontal to the surface of the substrate, and reaches a boundary 34a of the power supply line capacitance cell 34. As shown in FIG. 7, in the first polysilicon electrode 43, a portion opposite to the ground wiring 5 also extends to the same direction as the extension of the ground wiring 5, and reaches a boundary 34b of the power supply line capacitance cell 34. This structure enables the increase in the capacitance generated by the first polysilicon electrode 43 and the ground wiring 5.

Figure 14:
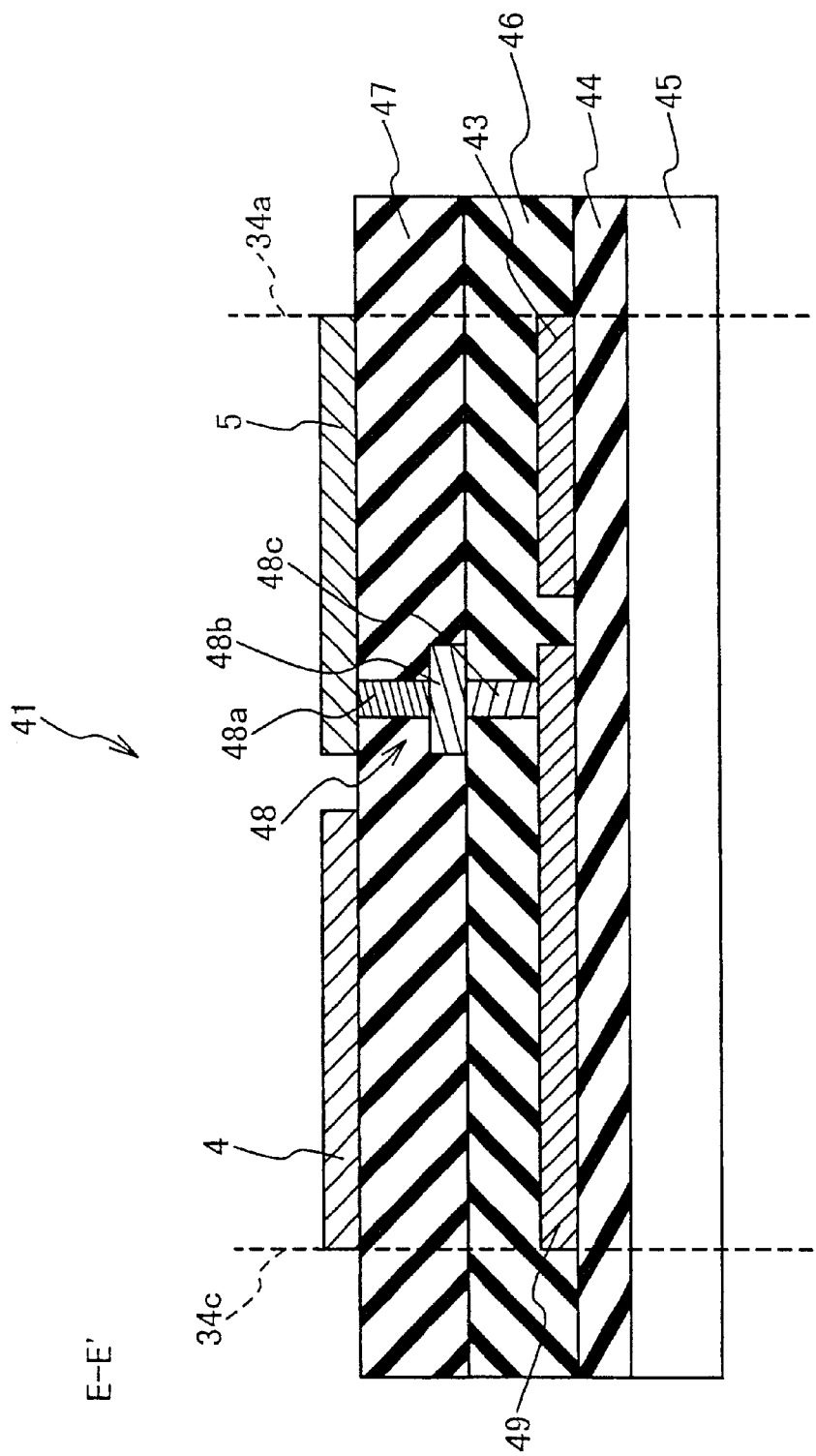
FIG. 14 is a section view showing a structure taken on a section E–E' of the power supply line bypass capacitor of the first embodiment of the present invention.

The power supply line bypass capacitor 41 further contains a contact 48, as shown in FIG. 14. The contact 48 is connected to the ground wiring 5. As shown in FIG. 14, the contact 48 is composed of a plug 48a, a land 48b and a plug 48c. The contact 48 is connected to a second polysilicon electrode 49.

The second polysilicon electrode 49 is formed parallel to the first polysilicon electrode 43. The second polysilicon electrode 49 is formed on the first insulation film 44, similarly to the first polysilicon electrode 43. The second and third insulation films 46, 47 are sandwiched between the second polysilicon electrode 49 and the power supply wiring 4. The second polysilicon electrode 49 is opposite to the power supply wiring 4. A capacitance is generated in the space in which the second polysilicon electrode 49 and the power supply wiring 4 are opposite to each other.

The second polysilicon electrode 49 extends from the contact 48 to a direction of a side on which the power supply wiring 4 is present in a direction horizontal to the surface of the substrate, and reaches a boundary 34c of the power supply line capacitance cell 34.

As shown in FIG. 7, in the second polysilicon electrode 49, a portion opposite to the power supply wiring 4 also extends to the same direction as the extension of the power supply wiring 4, and reaches a boundary 34d of the power supply line capacitance cell 34. This structure enables the increase in the capacitance generated by the second polysilicon electrode 49 and the power supply wiring 4.

The power supply line bypass capacitor 41 has the above-mentioned structure, and effectively suppresses the noise in the power supply wiring 4 and the ground wiring 5. Thus, the noise is suppressed in the circuit within the semiconductor apparatus 10.

In addition, the power supply wiring 4 and the ground wiring 5 are constituted by the second wiring layer, in this embodiment. However, it may be constituted by the first wiring layer. At this time, the plug 42a, the land 42b, the plug 48a and the land 48b are not formed. The power supply wiring 4 and the first polysilicon electrode 43 are connected through the plug 42c. The ground wiring 5 and the second polysilicon electrode 49 are connected through the plug 48c. This configuration enables the capacitance of the power supply line bypass capacitor 41 to be further increased.

When this embodiment is applied to the semiconductor apparatus having three or more wiring layers, the power supply wiring 4 and the ground wiring 5 may be constituted by the wiring which is not the second wiring layer.

Figure 15:
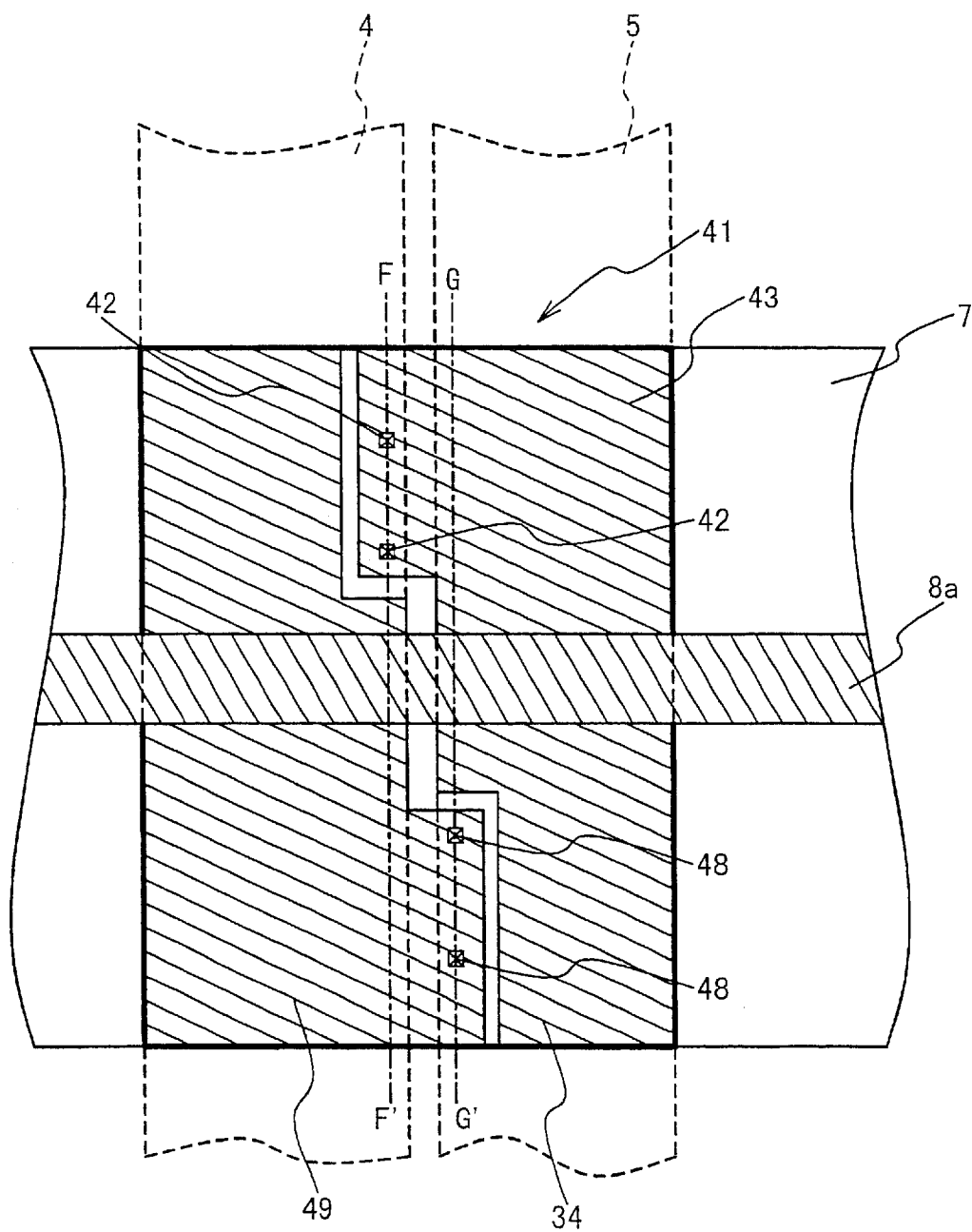
FIG. 15 is a plan view showing another configuration of the power supply line bypass capacitor of the first embodiment of the present invention.
Figure 16:
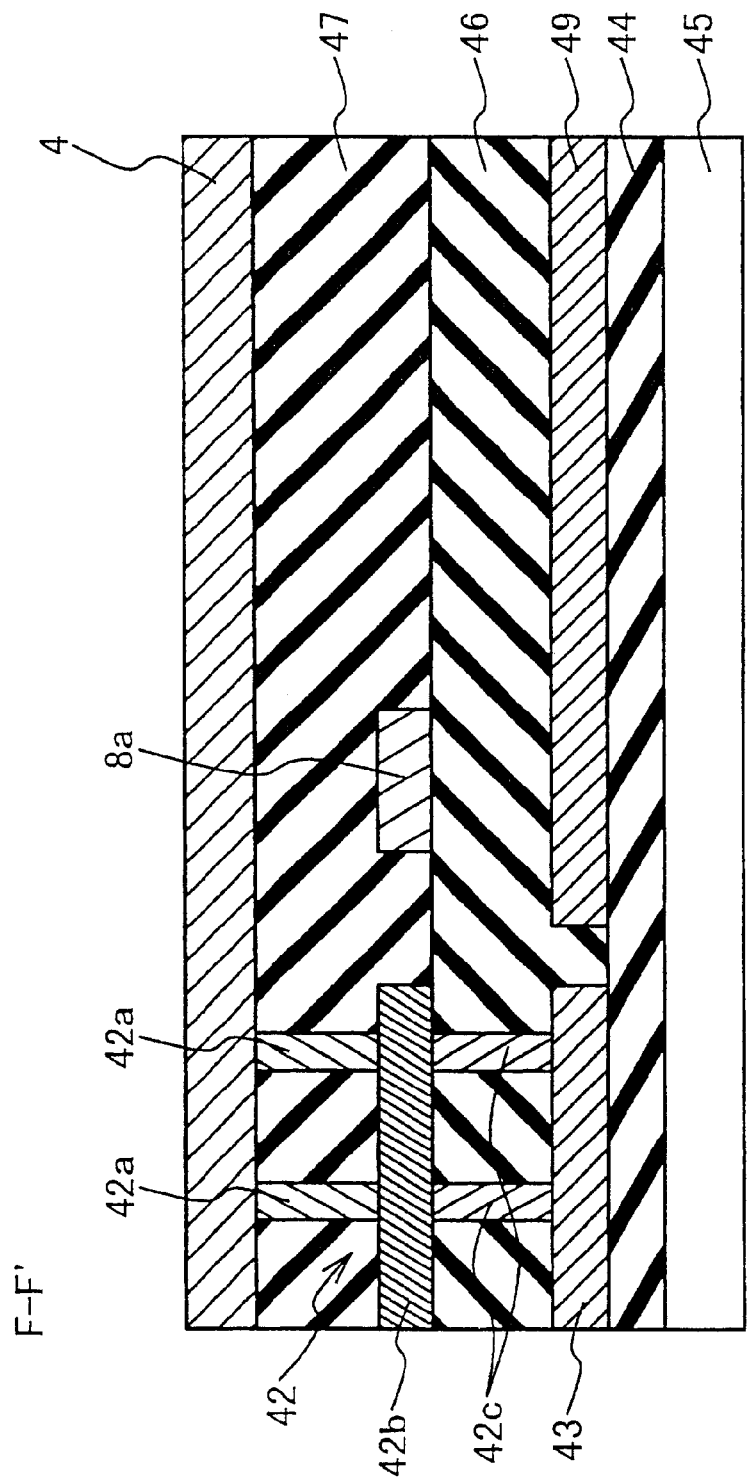
FIG. 16 is a section view showing a structure taken on a section F–F' of another structure of the power supply line bypass capacitor of the first embodiment of the present invention.
Figure 17:
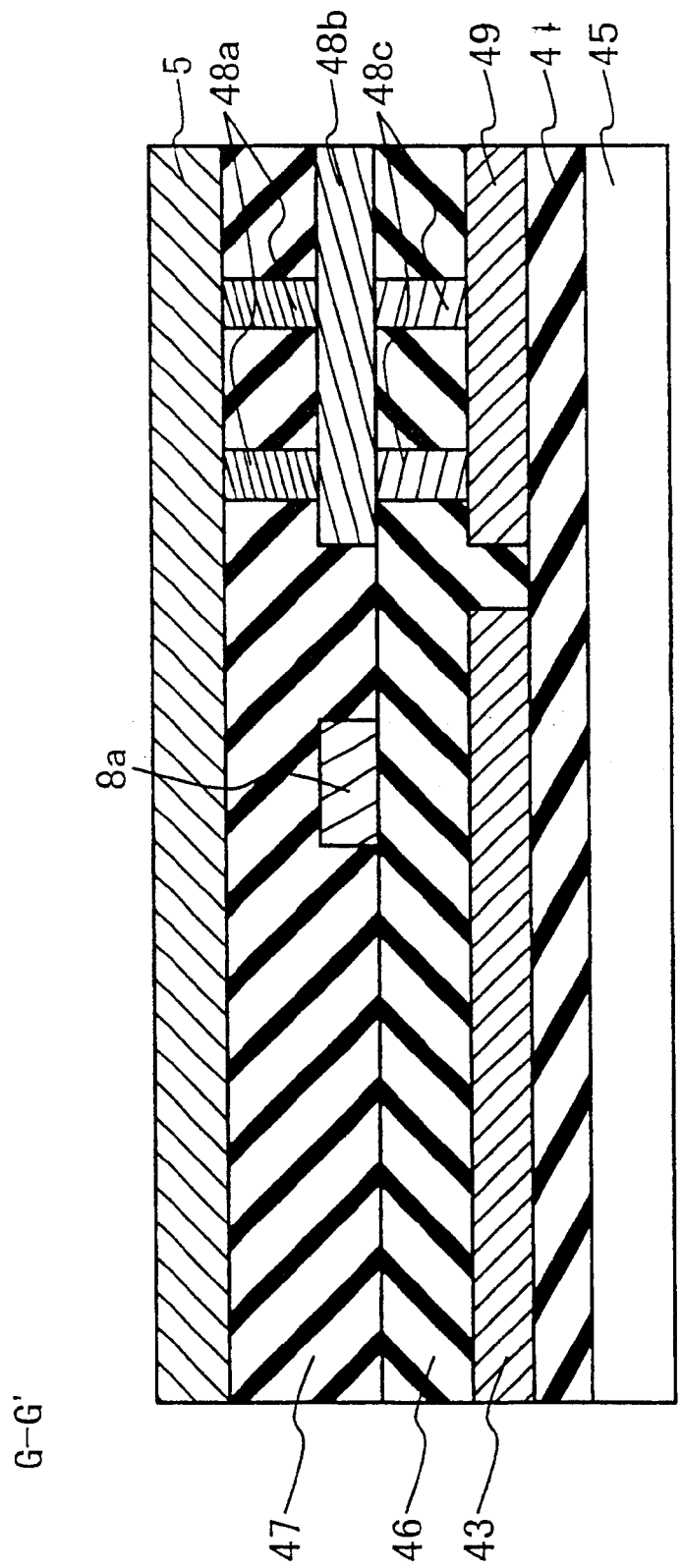
FIG. 17 is a section view showing a structure taken on a section G–G' of another structure of the power supply line bypass capacitor of the first embodiment of the present invention.

As-shown in FIGS. 15 to 17, it may be designed to insert the wiring 8 between the contacts, 42, 48. The wiring inserted between the contacts 42, 48 is illustrated as a wiring 8a. As shown in FIG. 16, the wiring 8a is formed parallel to the land 42b on a section F–F'. In addition, as shown in FIG. 16, the wiring 8a is formed parallel to the land 48b, on a section G–G'. The insertion of the wiring 8a between the contacts 42, 48 enables the free degree of the wiring to be improved.

Figure 18:
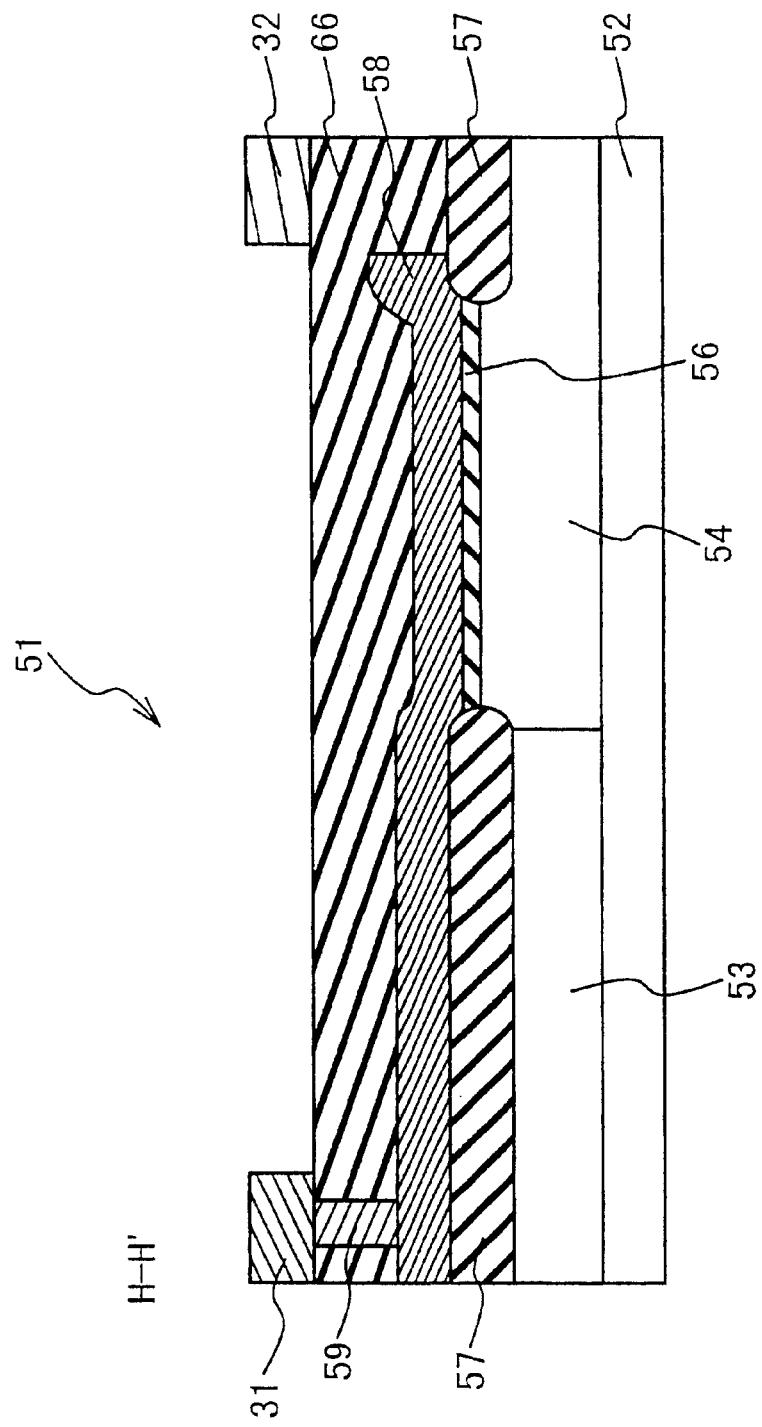
FIG. 18 is a section view showing a structure of a section H–H' of an inner primitive area bypass capacitor of the first embodiment of the present invention.
Figure 19:
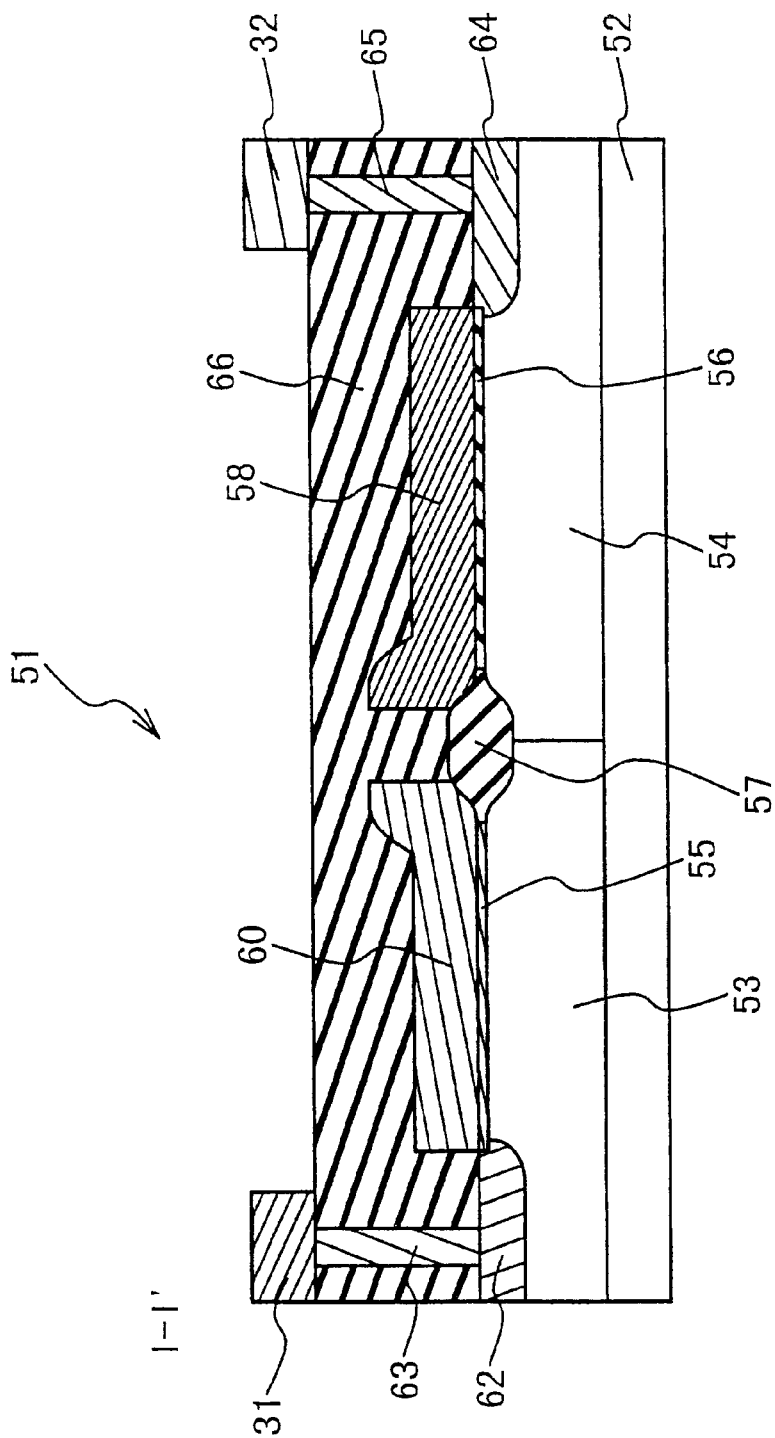
FIG. 19 is a section view showing a structure of a section I–I' of the inner primitive area bypass capacitor of the first embodiment of the present invention.
Figure 20:
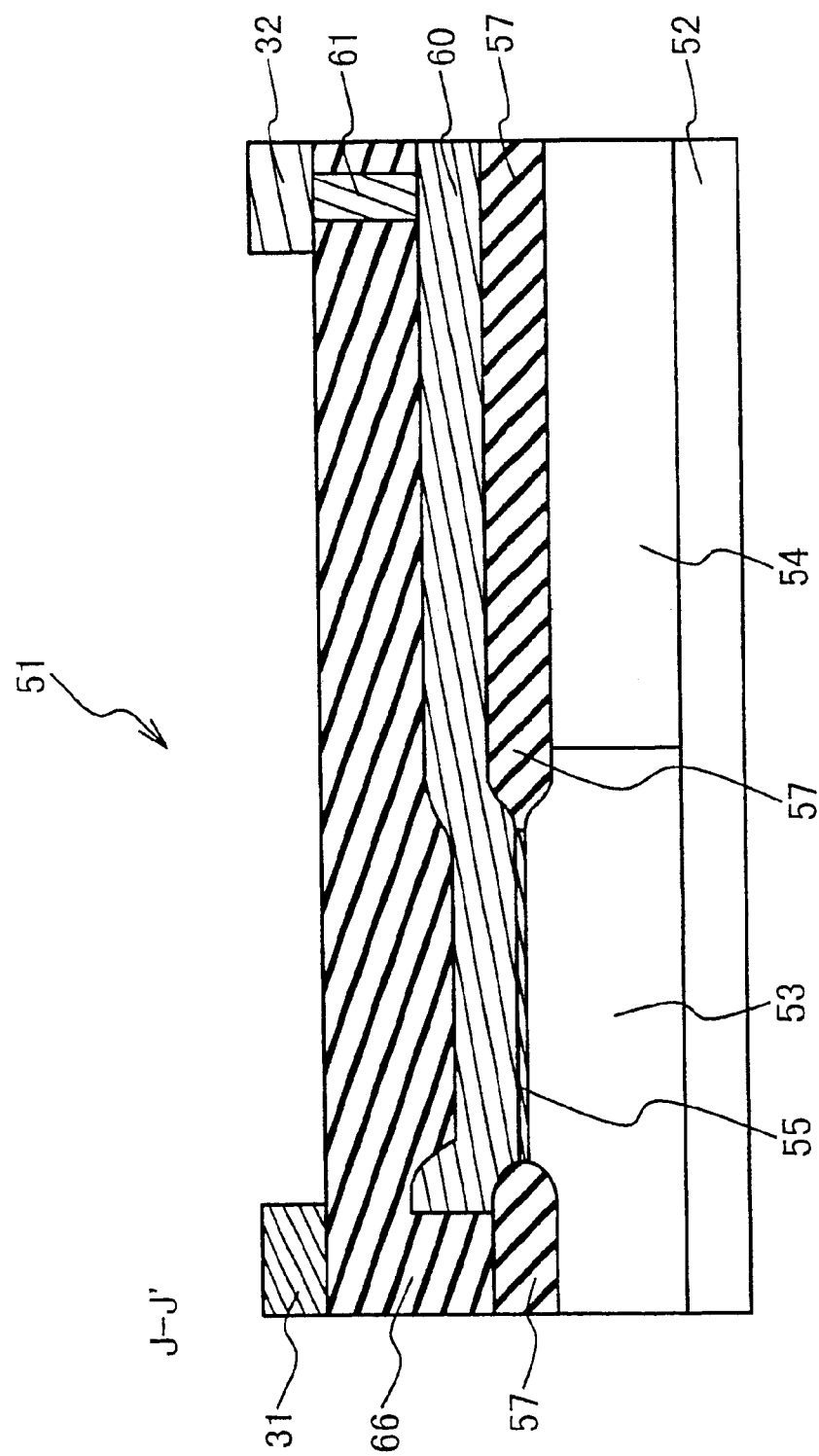
FIG. 20 is a section view showing. a structure of a section J–J' of the inner primitive area bypass capacitor of the first embodiment of the present invention.

The structure of the inner primitive area bypass capacitor 51 will be described below with reference to FIGS. 18 to 20. As shown in FIG. 19, the inner primitive area bypass capacitor 51 is formed on a semiconductor substrate 52. An n-well 53 and a p-well 54 are formed on the semiconductor substrate 52. An n-type diffusion layer 62 that is an n-type semiconductor is formed on the n-well 53. A doping of a high concentration is performed on the n-type diffusion layer 62. The n-type diffusion layer 62 is connected through a plug 63 to a power supply line 31. On the other hand, a p-type diffusion layer 64 that is a p-type semiconductor is formed in the p-well 54. A doping of a high concentration is performed on the p-type diffusion layer 64. The p-type diffusion layer 64 is connected through a plug 65 to a ground line 32.

A gate oxide film 55 is formed on the n-well 53. A gate oxide film 56 is formed on the p-well 54. A separation insulation film 57 is formed in a portion in which the n-type diffusion layer 62 and the gate oxide film 55 are not formed on the surface of the n-well 53 and a portion in which the p-type diffusion layer 64 and the gate oxide film 56 are not formed on the surface of the p-well 54.

A third polysilicon electrode 58 is formed on the gate insulation film 56. The third polysilicon electrode 58 and the p-well 54 face each other with the gate insulation film 56 between, and generate a capacitance. A portion in which the third polysilicon electrode 58 and the p-well 54 are opposite to each other is rectangular as shown in FIG. 18. The third polysilicon electrode 58 extends from a corner of the rectangle to a direction of the power supply line 31. The third polysilicon electrode 58 crosses the n-well 53. A portion of the third polysilicon electrode 58 crossing the n-well 53 is positioned on the separation insulation film 57, as shown in FIG. 18.

On the other hand, a fourth polysilicon electrode 60 is formed on the gate insulation film 55. The fourth polysilicon electrode 60 and the n-well 53 face each other with the gate insulation film 55 between, and generate a capacitance. A portion in which the fourth polysilicon electrode 60 and the n-well 53 are opposite to each other is rectangular as shown in FIG. 20. The fourth polysilicon electrode 60 extends from a corner of the rectangle to a direction of the ground line 32. The fourth polysilicon electrode 60 crosses the p-well 54. A portion of the fourth polysilicon electrode 60 crossing the p-well 54 is positioned on the separation insulation film 57, as shown in FIG. 20.

An insulation film 66 is formed on the third and fourth polysilicon electrodes 58, 60. The third polysilicon electrode 58 is connected through a plug 59 to the power supply line 31. The fourth polysilicon electrode 60 is connected through a plug 61 to the ground line 32.

The inner primitive area bypass capacitor 51 has the above-mentioned structure, and effectively suppresses the noise induced in the power supply line 31 and the ground line 32. Thus, the noise is suppressed in the circuit within the inner primitive area 7.

In addition, in this embodiment, a diffusion layer of a high concentration may be used instead of the n-well 53 and the p-well 54. In this case, an insulation film on which an insulator such as silicon oxide and the like is deposited is used instead of the gate oxide films 55, 56.

Figure 21:
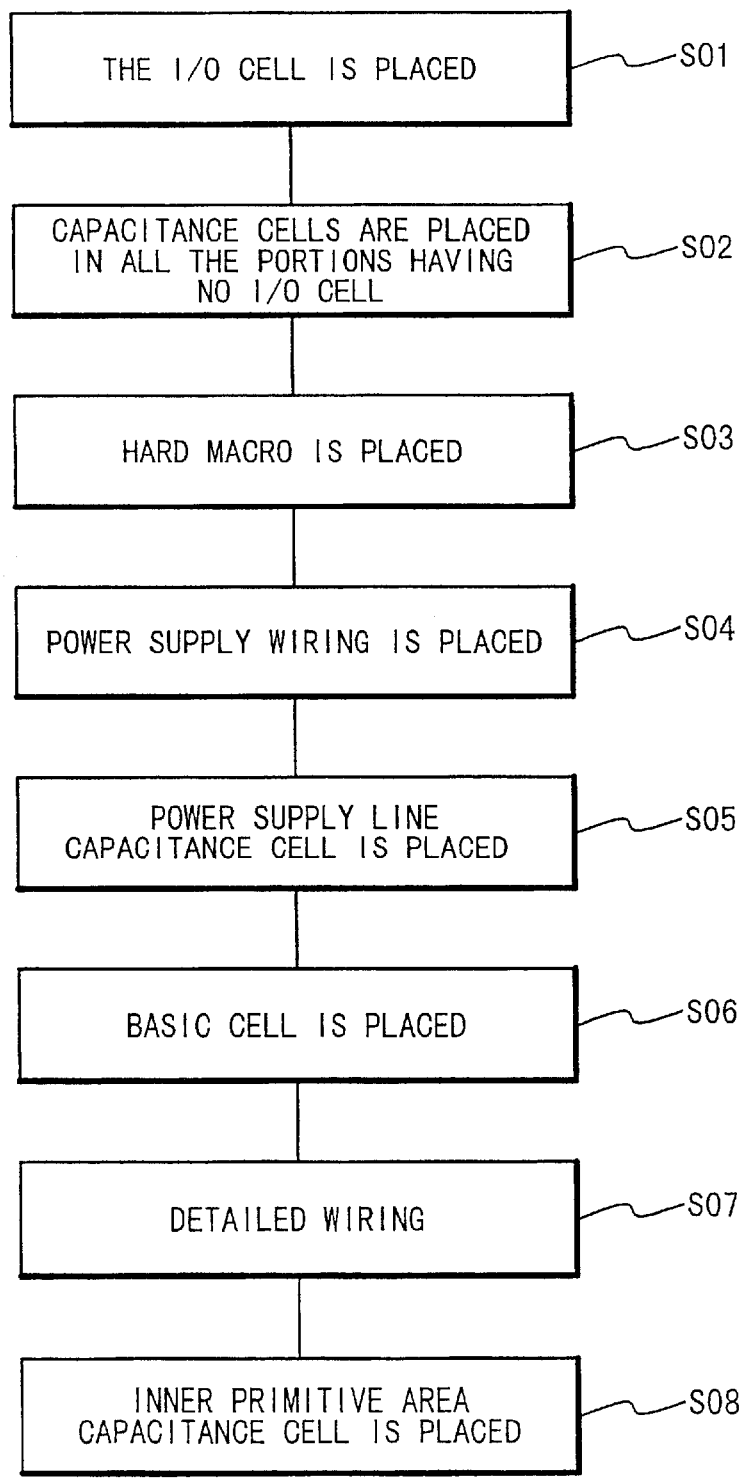
FIG. 21 is a flowchart showing a process of a semiconductor apparatus layout method of the first embodiment according to the present invention.

A method for laying out a semiconductor apparatus according to the present invention will be described below with reference to FIG. 21. The semiconductor apparatus of the first embodiment according to the present invention is laid out by using a programmed computer.

Step S01

The I/O cell 2 is placed in the I/O area 1. FIG. 10 shows a configuration in which the I/O cell 2 is placed. However, FIG. 4 shows only a part of the placed I/O cell 2. A step S02 is carried out after the step S01.

Step S02

The buffer capacitance cells 3 are placed in all the portions having no I/O cell 2 (S02). FIG. 4 shows only a part of the placed buffer capacitance cell 3.

As shown in FIG. 5, the buffer capacitance cell 3 is formed after it is selected from a group composed of two kinds of buffer capacitance cells 3a, 3b, on the basis of shapes of the I/O cells placed around it. The number of buffer capacitance cells contained by the group composed of the buffer capacitance cells may be a number except 2. As a buffer capacitance cell 3a, a buffer capacitance cell having a relatively small rectangle is selected on the basis of shapes of I/O cells 2a, 2b. As a buffer capacitance cell 3b, a buffer capacitance cell having a relatively large rectangle is selected on the basis of shapes of I/O cells 2b, 2c. A step S03 is carried out after the step S02.

Step S03

The hard macro 6 is placed. A step S04 is carried out after the step S03.

Step S04

The power supply wiring 4 and the ground wiring 5 are placed. The electric powers are supplied to the respective portions of the semiconductor apparatus 10 by the power supply wiring 4 and the ground wiring 5. The power supply wiring 4 and the ground wiring 5 extend from the I/O area 1 into the inside of the semiconductor apparatus 10. The parts of the power supply wiring 4 and the ground wiring 5 are connected to the hard macro 6. The power supply wiring 4 and the ground wiring 5 cross the inner primitive area 7, in order to connect the power supply wiring 4 and the ground wiring 5 to the circuit installed in the inner primitive area 7, respectively. A step S05 is carried out after the step S04.

Step S05

The power supply line capacitance cell 34 is placed such that it overlaps with the area in which the power supply wiring 4 and the ground wiring 5 are placed. The power supply line capacitance cell 34 includes the power supply line bypass capacitor 41 connected to the power supply wiring 4 and the ground wiring 5. The power supply line bypass capacitor 41 has the shape so that it does not interfere with the power supply wiring 4 and the ground wiring 5 in structure, as mentioned above. Thus, the power supply line capacitance cell 34 can be placed such that it overlaps with the area in which the power supply wiring 4 and the ground wiring 5 are placed. The power supply line capacitance cell 34 is placed in the area in which the inner primitive area 7 overlaps with the power supply wiring 4 and the ground wiring 5, at the step S05. At this time, the power supply line capacitance cells 34 are placed in all the portions in which the inner primitive area 7 overlaps with the power supply wiring 4 and the ground wiring 5. A step S06 is carried out after the step S05.

Step S06

The basic cell 33 is placed in the inner primitive area 7. The basic cell 33 is placed in a portion in which the power supply wiring 4 and the ground wiring 5 do not overlap with each other in the inner primitive area 7, namely, a portion having no power supply line capacitance cell 34. The basic cell 33 is placed so as to attain a desirable function. A step S07 is carried out after the step S06.

Step S07

The wiring 8 is placed. The wiring 8 is connected between the basic cell 33, the I/O area 1 and the hard macro 6, mutually, as necessary. This connection enables the desirable function to be attained. A step S08 is carried out after the step S07.

Step S08

An inner primitive area capacitance cell 35 is placed in the inner primitive area 7. The inner primitive area capacitance cell 35 has the structure that does not interfere with the wiring 8. In the inner primitive area 7, a portion without the basic cell 33 and the power supply line capacitance cell 34 is occupied by the inner primitive area capacitance cell 35. The layout is completed at the step S08.

The operations from the step S01 to the step S08 are carried out by using the programmed computer.

In the semiconductor apparatus layout method of the first embodiment according to the present invention, the bypass capacitor is accommodated in the cell that is the rectangular area, and the cell is placed. Thus, this enables the automatic layout. Also, in the semiconductor apparatus layout method of the first embodiment according to the present invention, the buffer capacitance cells 3 are placed in all the portions having no I/O cell 2, in the I/O area 1. Hence, this can increase the total of the capacitances of the bypass capacitors placed in the I/O area 1.

Moreover, any of the power supply line capacitance cell 34 and the inner primitive area capacitance cell 35 is placed in the portion having no basic cell 33, in the inner primitive area 7. Thus, this can increase the total of the capacitances of the bypass capacitors placed in the inner primitive area 7. Moreover, the power supply line capacitance cell 34 is placed in the portion in which the inner primitive area 7 crosses the power supply wiring 4 and the ground wiring 5. Hence, it is possible to effectively use the area in which the basic cell 33 can not be placed, in the inner primitive area 7. Accordingly, it is possible to increase the total of the capacitances of the bypass capacitors placed in the inner primitive area 7.

In addition, in the semiconductor apparatus layout method of the first embodiment, it may be designed to remove one or two of the buffer capacitance cell 3, the power supply line capacitance cell 34 and the inner primitive area capacitance cell 35. Moreover, the order from the step S01 to the step S08 can be changed to a degree that the object of the present invention is not damaged.

The semiconductor apparatus of the present invention has the bypass capacitor in which the space is effectively used. Moreover, the semiconductor apparatus of the present invention has the structure in which the automatic design is easy. In addition, the semiconductor apparatus layout method of the present invention can easily layout the semiconductor apparatus having the bypass capacitor.

What is claimed is:

1. A semiconductor apparatus, comprising:

a semiconductor substrate;

a first wiring provided in said semiconductor substrate;

a second wiring provided in said semiconductor substrate; and a capacitance cell, wherein said capacitance cell includes a bypass capacitor connecting said first wiring to said second wiring, wherein said bypass capacitor includes a first electrode section electronically connected to said first wiring, and said first electrode section is opposed to said second wiring, wherein said bypass capacitor further includes a second electrode electronically connected to said second wiring, and said second electrode is opposed to said first electrode, and wherein said bypass capacitor further includes a third electrode connected to said first wiring, and said third electrode is opposed to said second electrode.

2. A semiconductor apparatus, comprising:

a semiconductor substrate;

a first wiring provided in said semiconductor substrate;

a second wiring provided in said semiconductor substrate; and a capacitance cell, wherein said capacitance cell includes a bypass capacitor connecting said first wiring to said second wiring, wherein said bypass capacitor includes a first electrode section electronically connected to said first wiring, and said first electrode section is opposed to said second wiring, and wherein said bypass capacitor further includes a fourth electrode connected to said second wiring, and said fourth electrode is opposed to said first wiring.

3. The semiconductor apparatus according to claim 2, wherein a portion opposed to said first wiring of said fourth electrode extends in the same direction as an extending direction of said first wiring.

4. The semiconductor apparatus according to claim 3, wherein said bypass capacitor further includes:

a first connection section connecting said first electrode section to said first wiring; and a second connection section connecting said fourth electrode to said second wiring, and wherein said first connection section extends in a depth direction of said semiconductor substrate from said first wiring, and wherein said second connection section extends in said depth direction of said semiconductor substrate from said second wiring, and wherein a third wiring passes between said first and second connection sections.

5. A semiconductor apparatus, comprising:

a semiconductor substrate;

a function region provided in said semiconductor substrate, a predetermined function being performed in said function region;

a first wiring provided in said semiconductor substrate; and a second wiring provided in said semiconductor substrate, wherein said function region includes:

a circuit cell having a circuit; and a capacitance cell, and wherein said capacitance cell includes a bypass capacitor connecting said first wiring to said second wiring and said capacitance cell is arranged in a region where said circuit cell does not exist, and wherein a first conductive type of a first semiconductor region is formed in a portion included in said function region of a surface portion of said semiconductor substrate, and wherein said bypass capacitor further includes a fifth electrode connected to said first wiring, and wherein said first semiconductor region is opposed to said fifth electrode.

6. The semiconductor apparatus according to claim 5, wherein a second conductive type of a second semiconductor region is formed in said portion included in said function region of said surface portion of said semiconductor substrate, said second conductive type being different from said first conductive type, and wherein said bypass capacitor further includes a sixth electrode connected to said second wiring, and wherein said second semiconductor region is opposed to said sixth electrode.

7. The semiconductor apparatus according to claim 6, wherein said first and second wirings extend in a first direction parallel to said surface portion, and wherein said first and second semiconductor regions in parallel are provided between said first and second wirings, and wherein said fifth electrode extends in a second direction which is normal to said first direction and is parallel to said surface portion from said first wiring to cross said second semiconductor region and a portion opposite to said first semiconductor region of said fifth electrode extends in said first direction.

8. The semiconductor apparatus according to claim 6, wherein said sixth electrode extends in a direction which is normal to said first direction and is parallel to said surface portion from said second wiring to cross said first semiconductor region and a portion opposite to said second semiconductor region of said sixth electrode extends in said first direction.

9. The semiconductor apparatus according to claim 5, wherein said function region is an inner primitive region, and said circuit cell is a basic cell indicating a region in which a predetermined circuit is mounted.

10. A semiconductor apparatus layout method, comprising:

(a) arranging a circuit cell in a function region provided in a semiconductor substrate, wherein said circuit cell is cell indicating a region in which a circuit is mounted;

(b) arranging first and second wirings on said semiconductor substrate; and (c) arranging a capacitance cell in a region wherein said circuit cell does not exist of said function region, and wherein said function region is an inner primitive region and said circuit cell is a basic cell indicating a region in which a predetermined circuit is mounted.

11. A semiconductor apparatus layout method, comprising:

(d) arranging an I/O cell in an I/O region;

(e) arranging a first capacitance cell in a portion where said I/O cell does not exist of said I/O region, wherein said first capacitance cell is a cell indicating a region in which a first bypass capacitance is mounted;

(f) providing a power supply wiring and a grounded wiring, wherein said power supply wiring and said grounded wiring are electronically connected to said first bypass capacitance;

(g) arranging a second capacitance cell in a region where an inner primitive region overlaps with said power supply wiring and said grounded wiring, wherein said second capacitance cell is a cell indicating a region in which a second bypass capacitance is mounted;

(h) arranging a basic cell in said inner primitive region, wherein said basic cell is a cell indicating a region in which a predetermined circuit is mounted; and (i) arranging a third capacitance cell in a region where said basic cell and said second capacitance cell do not exist of said inner primitive region, wherein said third capacitance cell is a cell indicating a region in which a third bypass capacitance is mounted.

12. A computer readable recording medium for recording a program for a process, comprising:

(d) arranging an I/O cell in an I/O region;

(e) arranging a first capacitance cell in a portion where said I/O cell does not exist of said I/O region, wherein said first capacitance cell is a cell indicating a region in which a first bypass capacitance is mounted;

(f) providing a power supply wiring and a grounded wiring, wherein said power supply wiring and said grounded wiring are electronically connected to said first bypass capacitance;

(g) arranging a second capacitance cell in a region where an inner primitive region overlaps with said power supply wiring and said grounded wiring, wherein said second capacitance cell is a cell indicating a region in which a second bypass capacitance is mounted;

(h) arranging a basic cell in said inner primitive region, wherein said basic cell is a cell indicating a region in which a predetermined circuit is mounted; and (i) arranging a third capacitance cell in a region where said basic cell and said second capacitance cell do not exist of said inner primitive region, wherein said third capacitance cell is a cell indicating a region in which a third bypass capacitance is mounted.

13. A semiconductor apparatus, comprising:

a semiconductor substrate;

a capacitance cell including first and second electrodes on said semiconductor substrate;

first and second wirings on said semiconductor substrate; and an insulation layer between said first and second wirings and said first and second electrodes, wherein a majority of said first electrode faces said second wiring and a majority of said second electrode faces said first wiring, wherein said first electrode is electrically connected to said first wiring and said second electrode is electrically connected to said second wiring, and wherein said capacitance cell includes a bypass capacitor connecting said first. and second wirings to each other.

* * * * *